US009165942B2

(12) United States Patent
Nishijima

(10) Patent No.: US 9,165,942 B2
(45) Date of Patent: *Oct. 20, 2015

(54) PROGRAMMABLE LOGIC DEVICE

(71) Applicant: Semiconductor Energy Laboratory Co., Ltd., Atsugi-shi, Kanagawa-ken (JP)

(72) Inventor: Tatsuji Nishijima, Hadano (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 191 days.

This patent is subject to a terminal disclaimer.

(21) Appl. No.: 13/903,165

(22) Filed: May 28, 2013

(65) Prior Publication Data

US 2013/0256762 A1    Oct. 3, 2013

Related U.S. Application Data

(63) Continuation of application No. 13/453,147, filed on Apr. 23, 2012, now Pat. No. 8,476,927.

(30) Foreign Application Priority Data

Apr. 29, 2011   (JP) .................................. 2011-102585
May 20, 2011   (JP) .................................. 2011-113316

(51) Int. Cl.
*H03K 19/177*   (2006.01)
*H01L 25/00*    (2006.01)
*H01L 27/118*   (2006.01)

(52) U.S. Cl.
CPC ...... *H01L 27/11803* (2013.01); *H03K 19/1776* (2013.01); *H03K 19/17728* (2013.01); *H03K 19/17772* (2013.01)

(58) Field of Classification Search
USPC .................................. 326/38–41, 46–47, 101
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP   1 737 044 A   12/2006
EP   2 226 847 A    9/2010
(Continued)

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Anh Tran
(74) *Attorney, Agent, or Firm* — Eric J. Robinson; Robinson Intellectual Property Law Office, P.C.

(57)    ABSTRACT

An object of the present invention is to provide a programmable logic device which has short start-up time after supply of power is stopped, is highly integrated, and operates with low power. In a programmable logic device including an input/output block, a plurality of logic blocks each including a logic element, and a wiring connecting the plurality of logic blocks, the logic element has a configuration memory for holding configuration data and a look-up table including a selection circuit. The configuration memory includes a plurality of memory elements each of which includes a transistor whose channel region is in an oxide semiconductor film and an arithmetic circuit provided between the transistor and the selection circuit. Configuration data is selectively changed and output by the selection circuit in accordance with an input signal.

18 Claims, 30 Drawing Sheets

(56) References Cited

U.S. PATENT DOCUMENTS

| | | |
|---|---|---|
| 5,889,413 A | 3/1999 | Bauer |
| 6,118,298 A | 9/2000 | Bauer et al. |
| 6,172,521 B1 | 1/2001 | Motomura |
| 6,262,597 B1 | 7/2001 | Bauer et al. |
| 6,288,568 B1 | 9/2001 | Bauer et al. |
| 6,294,274 B1 | 9/2001 | Kawazoe et al. |
| 6,297,665 B1 | 10/2001 | Bauer et al. |
| 6,323,682 B1 | 11/2001 | Bauer et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,075,333 B1 | 7/2006 | Chaudhary et al. |
| 7,105,868 B2 | 9/2006 | Nause et al. |
| 7,116,131 B1 | 10/2006 | Chirania et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,492,182 B2 | 2/2009 | McCollum et al. |
| 7,501,293 B2 | 3/2009 | Ito et al. |
| 7,598,769 B2 | 10/2009 | Leung |
| 7,674,650 B2 | 3/2010 | Akimoto et al. |
| 7,732,819 B2 | 6/2010 | Akimoto et al. |
| 7,750,671 B2 | 7/2010 | Kang |
| 7,816,947 B1 | 10/2010 | Wang |
| 8,476,927 B2 * | 7/2013 | Nishijima ................. 326/40 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101332 A1 | 5/2011 | Yamazaki et al. |
| 2012/0212995 A1 | 8/2012 | Kurokawa |
| 2012/0268164 A1 | 10/2012 | Kobayashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-285014 A | 10/1998 |
| JP | 11-505377 | 5/1999 |
| JP | 2000-044236 A | 2/2000 |
| JP | 2000-150900 A | 5/2000 |
| JP | 2001-504657 | 4/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-216529 A | 9/2008 |
| JP | 2008-219883 A | 9/2008 |
| WO | WO-98/23033 | 5/1998 |
| WO | WO 2004/114391 | 12/2004 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

(56) References Cited

OTHER PUBLICATIONS

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Prins et al., "A Ferroelectric Transparent Thin-Film Transistor," Appl. Phys. Lett. (Applied Physics Letters), Jun. 17, 1996, vol. 68, No. 25, pp. 3650-3652.
Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.
Kimizuka et al., "Syntheses and Single-Crystal Data of Homologous Compounds, $In_2O_3(ZnO)_m$ ($m$ = 3, 4, and 5), $InGaO_3(ZnO)_3$, and $Ga_2O_3(ZnO)_m$ ($m$ = 7, 8, 9, and 16) in the $In_2O_3$—$ZnGa_2O_4$—ZnO System," Journal of Solid State Chemistry, Apr. 1, 1995, vol. 116, No. 1, pp. 170-178.
Nomura et al., "Thin-Film Transistor Fabricated in Single-Crystalline Transparent Oxide Semiconductor," Science, May 23, 2003, vol. 300, No. 5623, pp. 1269-1272.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Li et al., "Modulated Structures of Homologous Compounds $InMO_3(ZnO)_m$ ($M$=In,Ga; $m$=Integer) Described by Four-Dimensional Superspace Group," Journal of Solid State Chemistry, 1998, vol. 139, pp. 347-355.
Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Tsuda et al., "Ultra Low Power Consumption Technologies for Mobile TFT-LCDs," IDW '02: Proceedings of the 9th International Display Workshops, Dec. 4, 2002, pp. 295-298.
Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.
Park et al., "High performance amorphous oxide thin film transistors with self-aligned top-gate structure," IEDM 09: Technical Digest of International Electron Devices Meeting, Dec. 7, 2009, pp. 191-194.
Kurokawa et al., "UHF RFCPUs on Flexible and Glass Substrates for Secure RFID Systems," Journal of Solid-State Circuits, 2008, vol. 43, No. 1, pp. 292-299.
Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.
Park et al., "Amorphous Indium—Gallium—Zinc Oxide TFTs and their Application for Large Size AMOLED," AM-FPD '08 Digest of Technical Papers, Jul. 2, 2008, pp. 275-278.
Park et al., "Challenge to Future Displays: Transparent AM-OLED Driven by PEALD Grown ZnO TFT," IMID '07 Digest, 2007, pp. 1249-1252.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Osada et al., "Development of Driver-Integrated Panel using Amorphous In—Ga—Zn—Oxide TFT," AM-FPD '09 Digest of Technical Papers, Jul. 1, 2009, pp. 33-36.
Hirao et al., "Novel Top-Gate Zinc Oxide Thin-Film Transistors (ZnO TFTs) for AMLCDs," Journal of the SID, 2007, vol. 15, No. 1, pp. 17-22.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara et al., "21.3: 4.0 in. QVGA AMOLED Display Using In—Ga—Zn—Oxide TFTs with a Novel Passivation Layer," SID Digest '09: SID International Symposium Digest of Technical Papers, May 31, 2009, pp. 284-287.
Miyasaka, "Suftla Flexible Microelectronics on their Way to Business," SID Digest '07: SID International Symposium Digest of Technical Papers, 2007, vol. 38, pp. 1673-1676.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

(56) References Cited

OTHER PUBLICATIONS

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

\* cited by examiner

FIG. 15A  FIG. 15B
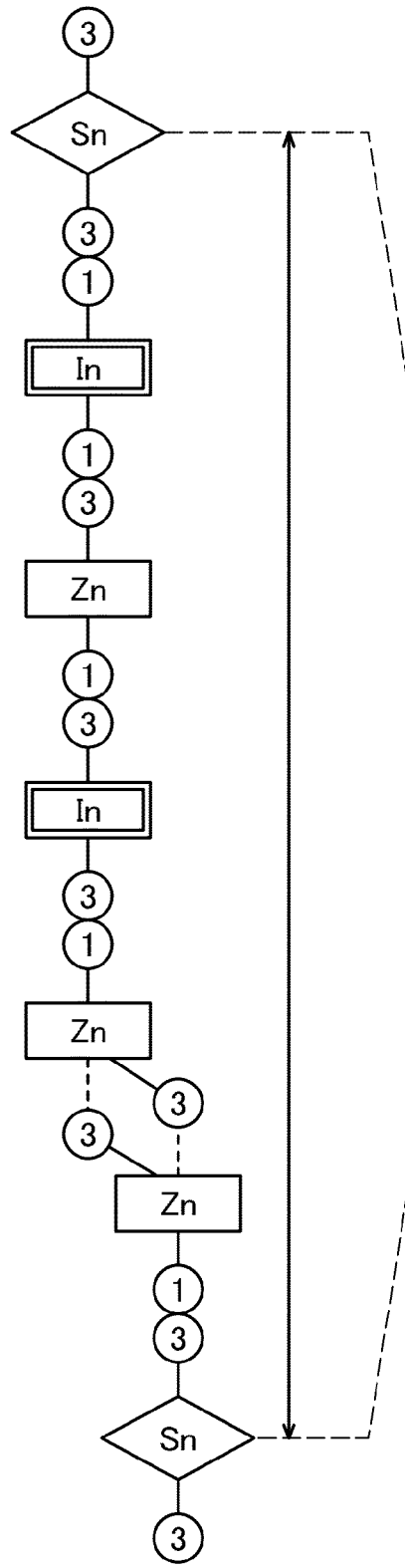
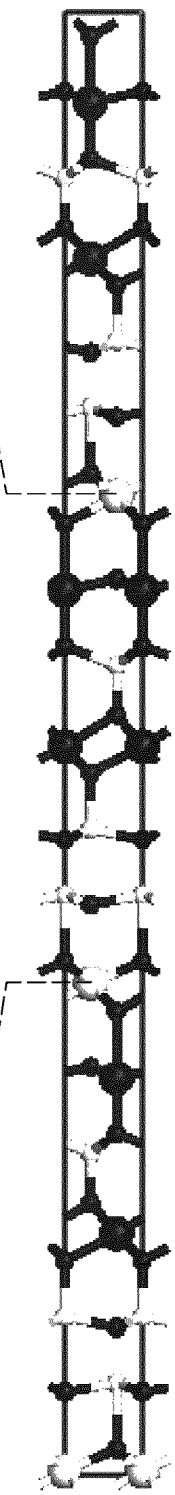
FIG. 15C
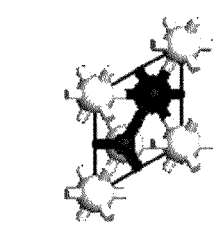
- In
- Sn
- Zn
- O

PROGRAMMABLE LOGIC DEVICE

BACKGROUND OF THE INVENTION

1. Field of the Invention

The present invention relates to a programmable logic device. The present invention further relates to a semiconductor device using the programmable logic device, and an electronic device using the semiconductor device.

2. Description of the Related Art

Programmable logic devices show flexibility in a reduction in development period and a change in design specification as compared to conventional application specific integrated circuits (ASIC) and gate arrays, which is advantageous. Therefore, a semiconductor device including the programmable logic device has been developed actively.

The programmable logic device includes, for example, a plurality of logic blocks each including a plurality of logic elements, wirings connecting the a plurality of logic blocks, and an input/output block. When the functions of the logic elements are changed, the function of the programmable logic device can be changed.

The logic element is formed using, for example, a look-up table or the like. The look-up table performs arithmetic processing based on setting data when an input signal is input to the look-up table, and then the look-up table outputs a signal. Here, the setting data is stored in a memory element that corresponds to each of the logic elements. Further, the look-up table can perform different arithmetic processing in accordance with the data stored in the memory element. Thus, the function of the logic element can be specified when specific setting data is stored in the memory element.

The setting data or the like of the look-up table is referred to as configuration data. In addition, the storage circuits that correspond to the logic elements and store the configuration data are referred to as configuration memories. The circuit structure of the programmable logic device can be changed into a circuit structure suitable for a user's request when desired configuration data is produced (programmed) and configuration is performed.

The configuration memory has been formed using a volatile memory such as a static random access memory (SRAM). However, in the case of using a volatile memory, information (configuration data) held in the configuration memory is lost when supply of power is stopped. Therefore, information needs to be written to the configuration memory after the beginning of supply of power; thus, time from the beginning of supply of power to the beginning of operation of the programmable logic device (hereinafter, referred to as start-up time) is long.

In order to shorten start-up time after supply of power is stopped, the programmable logic device is proposed in which the configuration memory is a non-volatile memory such as an electrically erasable programmable read-only memory (EEPROM) or a ferroelectric RAM (FeRAM) (see Patent Document 1).

REFERENCE

[Patent Document 1] Japanese Published Patent Application No. 10-285014.

SUMMARY OF THE INVENTION

However, writing voltage of an EEPROM is high. In the case of using an EEPROM as the configuration memory, a step-up circuit is needed for writing of configuration data, that is a disadvantage in higher integration and lower power consumption of the programmable logic device. A FeRAM has limitation on the number of reads and thus is not appropriate as the configuration memory.

Here, an object of the present invention is to provide a programmable logic device which has short start-up time after supply of power is stopped, is highly integrated, and operates with low power.

According to an embodiment of the present invention, in a programmable logic device including an input/output block, a plurality of logic blocks each including a logic element, and a wiring connecting the plurality of logic blocks, the logic element has a configuration memory for holding configuration data and a look-up table including a selection circuit. The configuration memory includes a plurality of memory elements each of which includes a transistor whose channel region is in an oxide semiconductor film and an arithmetic circuit provided between the transistor and the selection circuit. Configuration data is selectively changed and output by the selection circuit in accordance with an input signal.

Note that one of a source and a drain of the transistor whose channel region is in an oxide semiconductor film is connected to an input terminal of the arithmetic circuit. An output terminal of the arithmetic circuit is connected to the selection circuit. Further, the look-up table has an output terminal and N input terminal(s) (N is a natural number) connected to the selection circuit. The configuration memory has $2^N$ memory elements.

Further, in the memory element, the arithmetic circuit connected to the transistor is an inverter, a buffer, a NAND circuit, an AND circuit, a NOR circuit, or an OR circuit. In addition, the arithmetic circuit includes a transistor formed using a semiconductor substrate or a semiconductor film provided over an insulating substrate.

Further, the memory element may have a capacitor connected to the transistor and the arithmetic circuit. The capacitor has a first electrode, an insulating film, and a second electrode. One of the first electrode and the second electrode is connected to the one of the source and the drain of the transistor and the input terminal of the arithmetic circuit. The other of the first electrode and the second electrode is connected to a fixed potential wiring.

The configuration memory has the memory element including the arithmetic circuit and the transistor whose channel region is in an oxide semiconductor film. The potential (or corresponding electric charge) of one of a source and a drain of the transistor whose channel region is in an oxide semiconductor film, and the potential (or corresponding electric charge) of a connection portion of the arithmetic circuit are controlled in accordance with configuration data, whereby data can be stored in the memory element. The transistor whose channel region is in an oxide semiconductor film has a very low off-state current, so that even after supply of power supply voltage is stopped, the potential of the one of the source and the drain of the transistor can be held for a long time. Therefore, the memory element included in the configuration memory is non-volatile, and can hold stored data (configuration data) after supply of power supply voltage is stopped.

In addition, the above non-volatile memory element stores data in such a manner that a signal potential corresponding to data is input to the one of the source and the drain of the transistor whose channel region is in an oxide semiconductor film, and the transistor having a very low off-state current is turned off to make the one of the source and the drain go to a floating state. Thus, the non-volatile memory element does not easily cause degradation due to repetitive data rewriting, and rewritability can be improved.

A programmable logic device according to an embodiment of the present invention has a plurality of logic blocks each including a logic element. The logic element has a look-up table including a configuration memory and a selection circuit. The look-up table in each logic element performs different arithmetic processing in accordance with the configuration data input thereto, which is stored in the configuration memory. In an embodiment of the present invention, a non-volatile memory element capable of holding configuration data is used as the configuration memory, start-up time after supply of power is stopped is short.

Further, the memory element included in the configuration memory has a transistor whose channel region is in an oxide semiconductor film and an arithmetic circuit connected to the transistor. The arithmetic circuit includes a transistor formed using a semiconductor substrate or a semiconductor film formed over an insulating substrate. Therefore, the transistor whose channel region is in an oxide semiconductor film can be stacked over the arithmetic circuit; that is, a programmable logic device can be highly integrated.

According to an embodiment of the present invention, a configuration memory is formed using a non-volatile memory element including a transistor whose channel region is in an oxide semiconductor film and an arithmetic circuit; therefore, data can be held in the configuration memory even when supply of power is stopped. As a result, a programmable logic device can have short start-up time and operate with low power. The memory element included in the configuration memory can be highly integrated because the arithmetic circuit and the transistor whose channel region is in an oxide semiconductor film can be stacked.

BRIEF DESCRIPTION OF THE DRAWINGS

FIGS. 15A to 15C are views illustrating a crystal structure of an oxide material.

FIGS. 16A to 16C views illustrating a crystal structure of an oxide material.

DETAILED DESCRIPTION OF THE INVENTION

Figure 1:
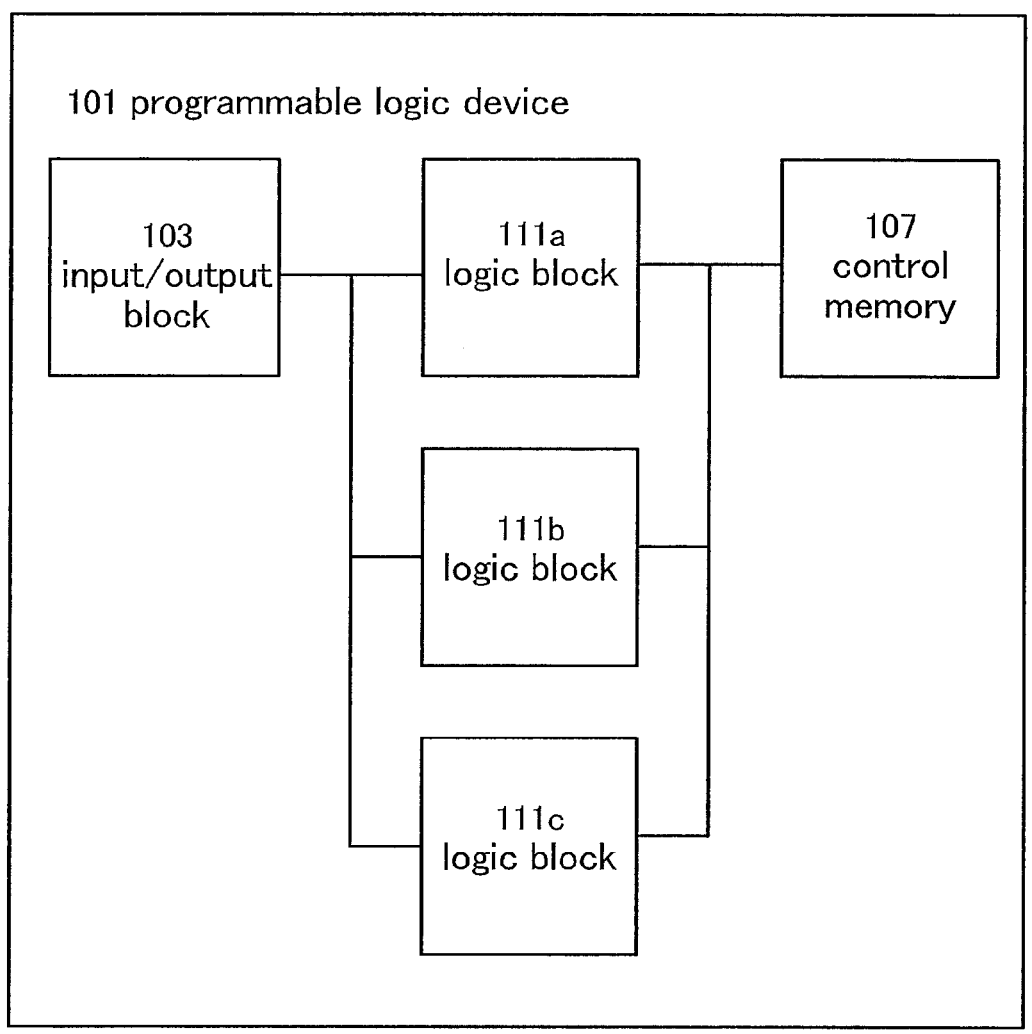
FIG. 1 is a block diagram illustrating a programmable logic device according to an embodiment of the present invention.

Embodiments of the present invention will be described below with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

One mode of a programmable logic device is described with reference to FIG. 1, FIG. 2, FIG. 3, FIGS. 4A to 4C, FIG. 5, FIG. 6, and FIG. 7.

FIG. 1 is a block diagram of one mode of a programmable logic device 101. The programmable logic device 101 includes an input/output block 103; a plurality of logic blocks 111a, 111b, and 111c, which have various functions; wirings; and a control memory 107; which are provided on the periphery of the programmable logic device 101. The connection of the wirings can be changed by a switch or the like.

The input/output block 103 controls transmission and reception of signals between the programmable logic device and the outside thereof. For typical example, the input/output block 103 sets a signal input from or output to an external terminal of the programmable logic device.

The control memory 107 holds data (configuration data) to be written to configuration memories included in the logic blocks 111a to 111c. The control memory 107 is a nonvolatile memory such as a flash ROM.

Note that three logic blocks 111a to 111c are shown in FIG. 1, but any number of logic blocks can be used. Further, the programmable logic device 101 may further include a multiplier, a phase locked loop (PLL) block, or the like. The multiplier has a function of multiplying plural pieces of data at high speed. The PLL block has a function of supplying a clock signal to a circuit in the programmable logic device.

Figure 2:
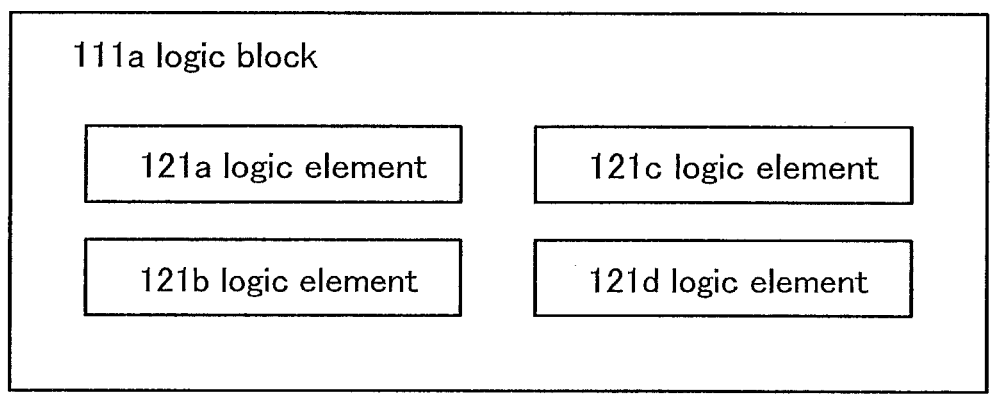
FIG. 2 is a block diagram illustrating a logic block.

FIG. 2 is a block diagram of one mode of a logic block. The logic block 111a includes a plurality of logic elements 121a, 121b, 121c, and 121d. Configuration data in each of the logic elements 121a to 121d are changed, whereby the function of the logic block can be changed. Note that although not illustrated, the plurality of logic elements are connected to each other through a wiring. Note that four logic elements are shown here, but any number of logic elements can be provided.

Figure 3:
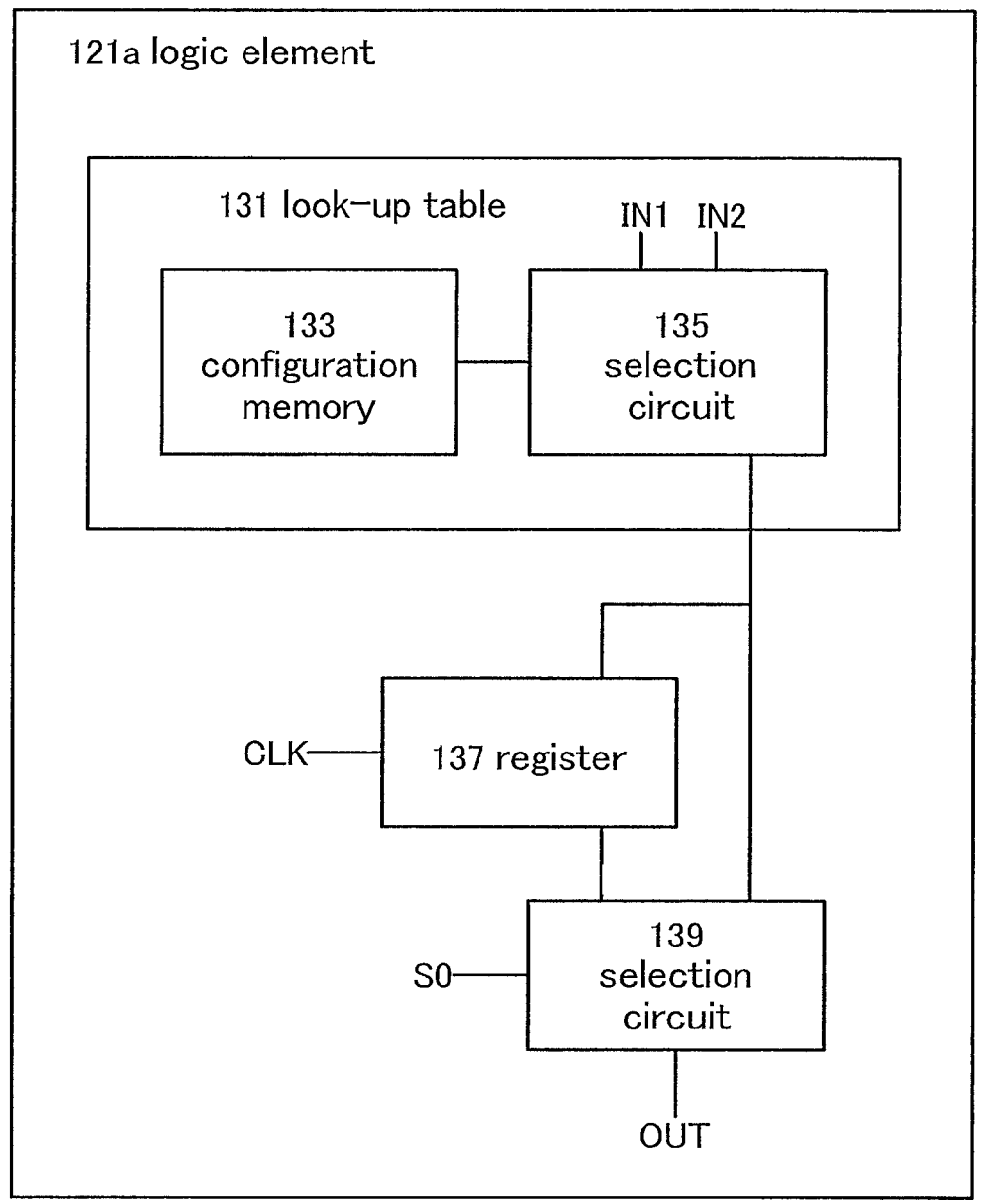
FIG. 3 is a block diagram illustrating a logic element.

FIG. 3 is a block diagram illustrating one mode of a logic element. The logic element 121a includes a look-up table 131 including a configuration memory 133 and a selection circuit 135, a register 137, and a selection circuit 139 for determining whether an output of the register 137 or an output of the look-up table 131 is used. Here, the selection circuit 139 can be a two-input one-output multiplexer.

The look-up table 131 performs arithmetic processing on an input signal in accordance with configuration data and outputs the signal.

The part of the signal output from the look-up table 131 is input to and held in the register 137. A clock signal CLK is input to the register 137, and the signal held in the register 137 is synchronized with the clock signal CLK. Then, the signal is output to the selection circuit 139.

The selection circuit 139 chooses one of an output signal from the look-up table 131 and an output signal from the register 137. In accordance with a selection signal (S0), the output signal from the look-up table 131 or the output signal from the register 137 is output from the logic element 121a to another logic element.

Figure 4A:
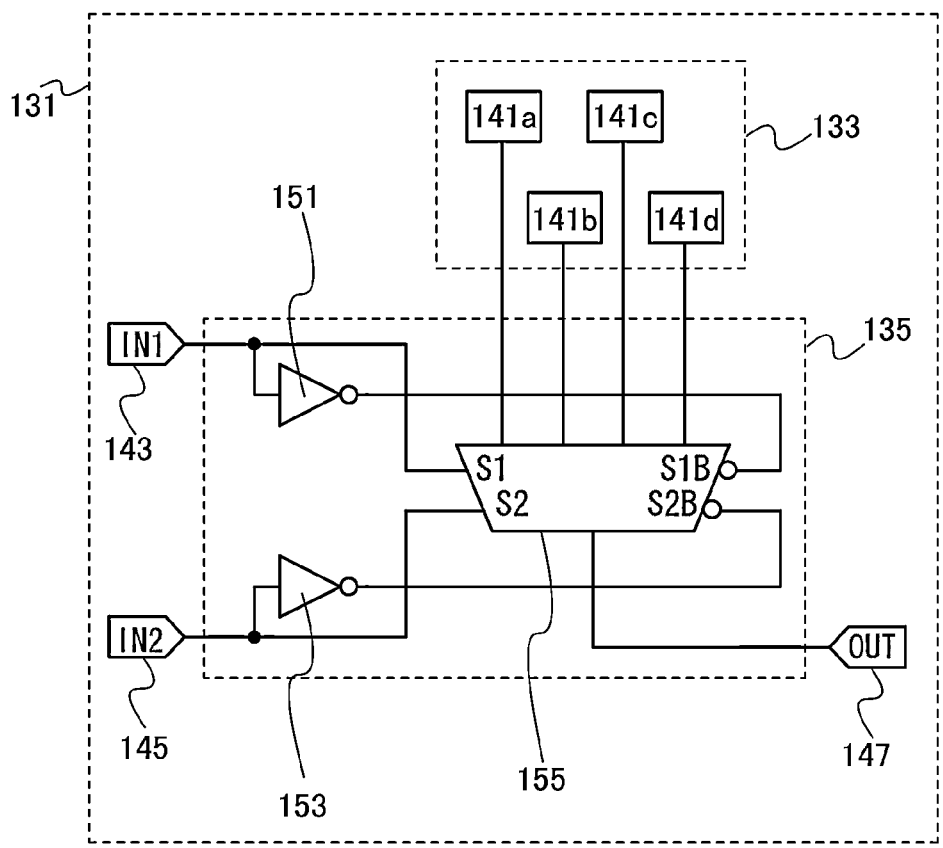
FIG. 4A is a circuit diagram illustrating a look-up table and FIGS. 4B and 4C are circuit diagrams illustrating memory elements.

FIG. 4A illustrates one mode of the look-up table 131. The look-up table 131 has the configuration memory 133 and the selection circuit 135. The configuration memory 133 includes a plurality of memory elements 141a, 141b, 141c, and 141d. The selection circuit 135 includes inverters 151 and 153 and a multiplexer 155 which outputs configuration data selected in accordance with an input signal. Further, the selection circuit 135 is connected to input terminals 143 and 145 and an output terminal 147 of the look-up table. The input terminal 143 is connected to the inverter 151 and the multiplexer 155. The input terminal 145 is connected to the inverter 153 and the multiplexer 155. Here, the multiplexer 155 is connected to two input terminals 143 and 145 connected to the inverters 151 and 153; accordingly, four signals are input to the multiplexer 155 in accordance with input of two signals. Specifically, a signal S1 input to the input terminal 143 and a signal S1B which is formed by inversion of the signal S1 by the inverter 151 are input to the multiplexer 155. Further, a signal S2 input to the input terminal 145 and a signal S2B which is formed by inversion of the signal S2 by the inverter 153 are input to the multiplexer 155.

When the look-up table 131 has N input terminals, the configuration memory 133 includes $2^N$ memory elements. Here, the numbers of the input terminals and the memory elements are two and four, respectively, but the numbers are determined depending on configuration data.

Next, the structure of the memory element provided in the configuration memory 133 is described with reference to FIGS. 4B and 4C.

Figure 4B:
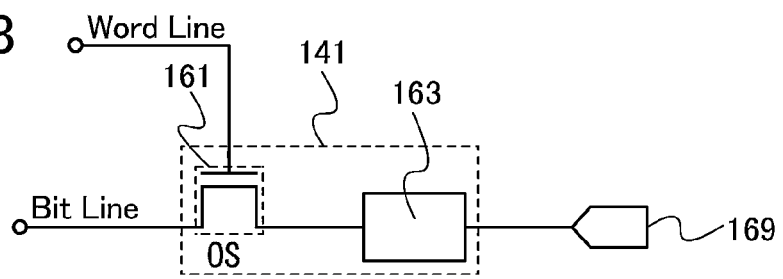

In FIG. 4B, a memory element 141 includes a transistor 161 including an oxide semiconductor film and an arithmetic circuit 163. Note that in FIG. 4B and FIG. 4C, "OS" is written beside the transistor 161 in order to indicate that the channel region of the transistor 161 is formed in the oxide semiconductor film. A gate of the transistor 161 is connected to a word line. One of a source and a drain of the transistor 161 is connected to a bit line. The other of the source and the drain of the transistor 161 is electrically connected to the arithmetic circuit 163. The arithmetic circuit 163 is electrically connected to the multiplexer 155 included in the selection circuit 135 illustrated in FIG. 4A through an output terminal 169.

Figure 4C:
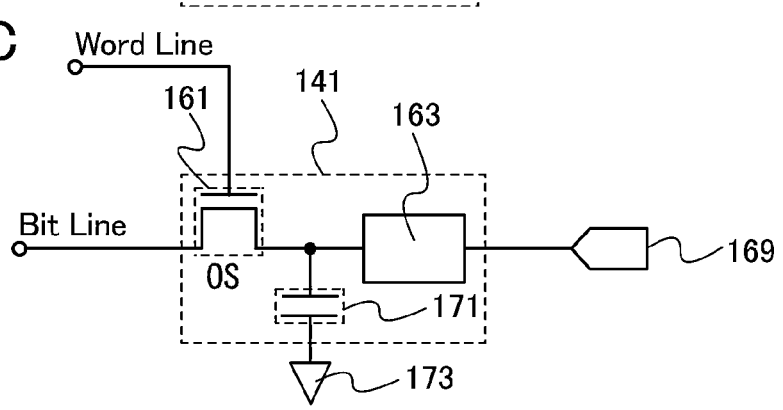

As illustrated in FIG. 4C, the memory element 141 may have a capacitor 171 connected to the arithmetic circuit 163 and the transistor 161 including an oxide semiconductor film. The arithmetic circuit 163 and the other of the source and the drain of the transistor 161 are electrically connected to one of pair of electrodes of the capacitor 171. The other of the pair of electrodes of the capacitor 171 is electrically connected to a fixed potential wiring 173.

The transistor 161 including an oxide semiconductor film has an oxide semiconductor film with an energy gap as wide as 2 eV or more, preferably 2.5 eV or more, more preferably 3 eV or more, in its channel region. Therefore, the transistor 161 including an oxide semiconductor film can have a very low off-state current. Note that instead of the transistor including an oxide semiconductor film, a transistor whose channel region includes silicon carbide, gallium nitride, or the like having an energy gap of 2 eV or more, preferably 2.5 eV or more, more preferably 3 eV or more can be used.

The arithmetic circuit 163 can be a circuit which processes an input signal input to a gate of a transistor and outputs the signal. Examples of such a circuit are an inverter, a buffer, a NAND circuit, an AND circuit, a NOR circuit, and an OR circuit. The arithmetic circuit 163 includes a transistor formed using a semiconductor substrate or a semiconductor film formed over an insulating substrate, which is to be described.

Here, as a memory element 141, an example of a circuit in which a buffer is used for the arithmetic circuit 163 is described with reference to FIG. 7.

In the buffer, one of a source and a drain of a first n-channel transistor 163a is connected to a wiring for supplying a low potential voltage Vss, and the other of the source and the drain of the first n-channel transistor 163a is connected to one of a source and a drain of a first p-channel transistor 163b. Further, the other of the source and the drain of the first p-channel transistor 163b is connected to a wiring for supplying a high potential voltage Vdd. Gates of the first n-channel transistor 163a and the first p-channel transistor 163b are connected to the other of the source and the drain of the transistor 161 including an oxide semiconductor film. One of a source and a drain of a second n-channel transistor 163c is connected to the wiring for supplying the low potential voltage Vss, and the other of the source and the drain of the second n-channel transistor 163c is connected to one of a source and a drain of a second p-channel transistor 163d. Further, the other of the source and the drain of the second p-channel transistor 163d is connected to the wiring for supplying the high potential voltage Vdd. Gates of the second n-channel transistor 163c and the second p-channel transistor 163d are connected to the other of the source and the drain of the first n-channel transistor 163a and the one of the source and the drain of the first p-channel transistor 163b. The other of the source and the drain of the second n-channel transistor 163c and the one of the source and the drain of the second p-channel transistor 163d are connected to the output terminal 169.

In the memory element 141, the potential (electric charge) of the other of the source and the drain of the transistor 161 is controlled in accordance with configuration data, whereby data is stored. For example, the memory element can store 1-bit data when a state in which a predetermined potential is held in the other of the source and the drain of the transistor 161 corresponds to "1" and a state in which the potential is not held in the other of the source and the drain of the transistor 161 corresponds to "0".

The other of the source and the drain of the transistor 161 is connected to the gates of the first n-channel transistor 163a and the first p-channel transistor 163b in the buffer serving as the arithmetic circuit 163. Thus, the potential held in the other of the source and the drain of the transistor 161 can be kept. Therefore, configuration data hardly leaks to another memory element.

Further, a very low off-state current of the transistor 161 including an oxide semiconductor film enables the memory element 141 to hold the potential of the other of the source and the drain of the transistor 161, that is, data for a long time even after supply of power supply voltage is stopped by turning off the transistor 161.

The memory element 141 functions as non-volatile memory when formed using a transistor including an oxide semiconductor in this manner. Further, the memory element 141 stores data in such a manner that a signal potential corresponding to the data is input to the transistor 161 and the transistor 161 is turned off so that the other of the source and the drain of the transistor 161 is in a floating state. Thus, the memory element 141 does not easily cause degradation due to repetitive data rewriting, and rewritability can be improved.

Further, in the memory element 141, when the capacitor 171 is connected to the other of the source and the drain of the transistor 161, the potential of the other of the source and the drain of the transistor 161 can be held more securely. In that case, the memory element 141 can store data in such a manner that a signal potential corresponding to the data is input to a predetermined node (the one of the pair of electrodes of the capacitor 171) and the transistor 161 is turned off to make the other of the source and the drain of the node be in a floating state. Thus, the memory element 141 does not easily cause degradation due to repetitive data rewriting, and rewritability can be improved.

A magnetic tunnel junction element (an MTJ element) is known as a non-volatile memory. The MTJ element stores data in a low resistance state when the spin directions in films provided above and below with an insulating film provided therebetween are parallel, and stores data in a high resistance state when the spin directions are not parallel. Therefore, the principles of the MTJ element and the memory including an oxide semiconductor described in this embodiment are completely different from each other. Table 1 shows comparison between the MTJ element and the semiconductor device according to this embodiment.

TABLE 1

| | | Spintronics (MTJ element) | Oxide Semiconductor |
|---|---|---|---|
| 1) | Heat Resistance | Curie temperature | Process temperature at 500° C. (reliability at 150° C.) |
| 2) | Driving Method | Current driving | Voltage driving |
| 3) | Writing Principle | Changing spin direction of magnetic body | Turning on/off FET |
| 4) | Si LSI | Suitable for bipolar LSI (MOS LSI is preferable for high integration because bipolar LSI is unsuitable for high integration. Note that W becomes larger.) | Suitable for MOS LSI |
| 5) | Overhead | Large (because of high Joule heat) | Smaller than overhead of the MTJ element by 2 to 3 or more orders of magnitude (because of charging and discharging of parasitic capacitance) |
| 6) | Nonvolatility | Utilizing spin | Utilizing low off-state current |
| 7) | Read Number | Without limitation | Without limitation |
| 8) | 3D Conversion | Difficult (at most two layers) | Easy (the number of layers is limitless) |
| 9) | Integration Degree ($F^2$) | 4 to 15 $F^2$ | Depends on the number of layers stacked in 3D conversion |
| 10) | Material | Magnetic rare-earth element | OS material |

TABLE 1-continued

| | Spintronics (MTJ element) | Oxide Semiconductor |
|---|---|---|
| 11) Cost per Bit | High | Low (might be slightly high depending on OS material) |
| 12) Resistance to Magnetic Field | Low | High |

The MTJ element has a disadvantage in that a magnetic property is lost when the temperature is higher than or equal to the Curie temperature because a magnetic material is used. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, although the MTJ element requires a low write current.

In principle, the MTJ element has low resistance to a magnetic field, so that the spin direction is likely to change when the MTJ element is exposed to a high magnetic field. In addition, it is necessary to control magnetic fluctuation which is caused by nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. Further, the MTJ element is expensive in terms of the material cost per bit.

On the other hand, the transistor including an oxide semiconductor in this embodiment has an element structure and an operation principle similar to those of a silicon MOSFET except that a semiconductor material for forming a channel is a metal oxide. Further, the transistor including an oxide semiconductor is not affected by a magnetic field, and does not cause soft errors. This shows that the transistor is highly compatible with a silicon integrated circuit.

The case where a normally off driving method is applied to the programmable logic device which has the configuration memory 133 including the memory element 141 which is illustrated in FIG. 4B is described.

(Operation at the Time of Supply of Power Supply Voltage and Operation of Storing Data)

While power supply voltage is supplied to the programmable logic device, that is, while the power supply voltage is supplied to the configuration memory 133 including the memory element 141 illustrated in FIG. 4B, a High voltage is applied to the word line of the transistor 161 to turn on the transistor 161 and a signal is input to the bit line to write data to the other of the source and the drain of the transistor 161.

In the case where the arithmetic circuit 163 is an inverter or a buffer, the power supply voltage is supplied to the arithmetic circuit 163, and the arithmetic circuit 163 is brought into conduction. That is, the arithmetic circuit 163 processes data written to the other of the source and the drain of the transistor 161 and the data is output to the output terminal 169. Further, in the case where the arithmetic circuit 163 is a NAND circuit, an AND circuit, a NOR circuit, or an OR circuit, a read signal is input to the arithmetic circuit 163, the arithmetic circuit 163 processes data written to the other of the source and the drain of the transistor 161, and the data is output to the output terminal 169.

Further when the memory element 141 stores configuration data, in the case where the arithmetic circuit 163 is an inverter or a buffer, the arithmetic circuit 163 is brought out of conduction to store data in the other of the source and the drain of the transistor 161. In the case where the arithmetic circuit 163 is a NAND circuit, an AND circuit, a NOR circuit, or an OR circuit, input of the read signal to the arithmetic circuit 163 is stopped, and thus, data is stored in the other of the source and the drain of the transistor 161.

(Operation of Standby of the Data)

After storage of data, a Low voltage is applied to the word line of the transistor 161 to turn off the transistor 161, so that data stored in the memory element 141 is not changed. Thus, standby of the data can be performed. The memory element 141 is non-volatile and the transistor 161 has a very low off-state current; therefore, by turning off the transistor 161, the potential of the one of the source and the drain of the transistor 161, that is, data can be held for a long time even after supply of power supply voltage is stopped.

As described above, standby of the data is performed and then supply of power supply voltage to the configuration memory 133 is stopped.

(Operation of Data Supply)

After supply of power supply voltage to the configuration memory 133 starts, in the case where the arithmetic circuit 163 is an inverter or a buffer, the power supply voltage is supplied to the arithmetic circuit 163 to bring the arithmetic circuit 163 into conduction. That is, the arithmetic circuit 163 processes data written to the other of the source and the drain of the transistor 161 and the data is output to the output terminal 169. In the case where the arithmetic circuit 163 is a NAND circuit, an AND circuit, a NOR circuit, or an OR circuit, the read data is input to the arithmetic circuit 163, the arithmetic circuit 163 processes data written to the other of the source and the drain of the transistor 161, and the data is output to the output terminal 169. Since the configuration memory is provided in the look-up table, configuration data can be read or written at high speed.

In the programmable logic device described in this embodiment, when power supply voltage is supplied again after supply of power supply voltage is stopped, writing of configuration data to the configuration memory is not needed and start-up time of the programmable logic device can be short. Therefore, in the programmable logic device, supply of the power supply voltage can be stopped frequently, and power consumption can be reduced dramatically by a normally-off driving method.

Further, a non-volatile memory element used for the configuration memory 133 has high rewritability and reliability, whereby the programmable logic device can be improved in endurance and reliability.

Next, the multiplexer 155 is described with reference to FIG. 5 and FIG. 6.

Figure 5:
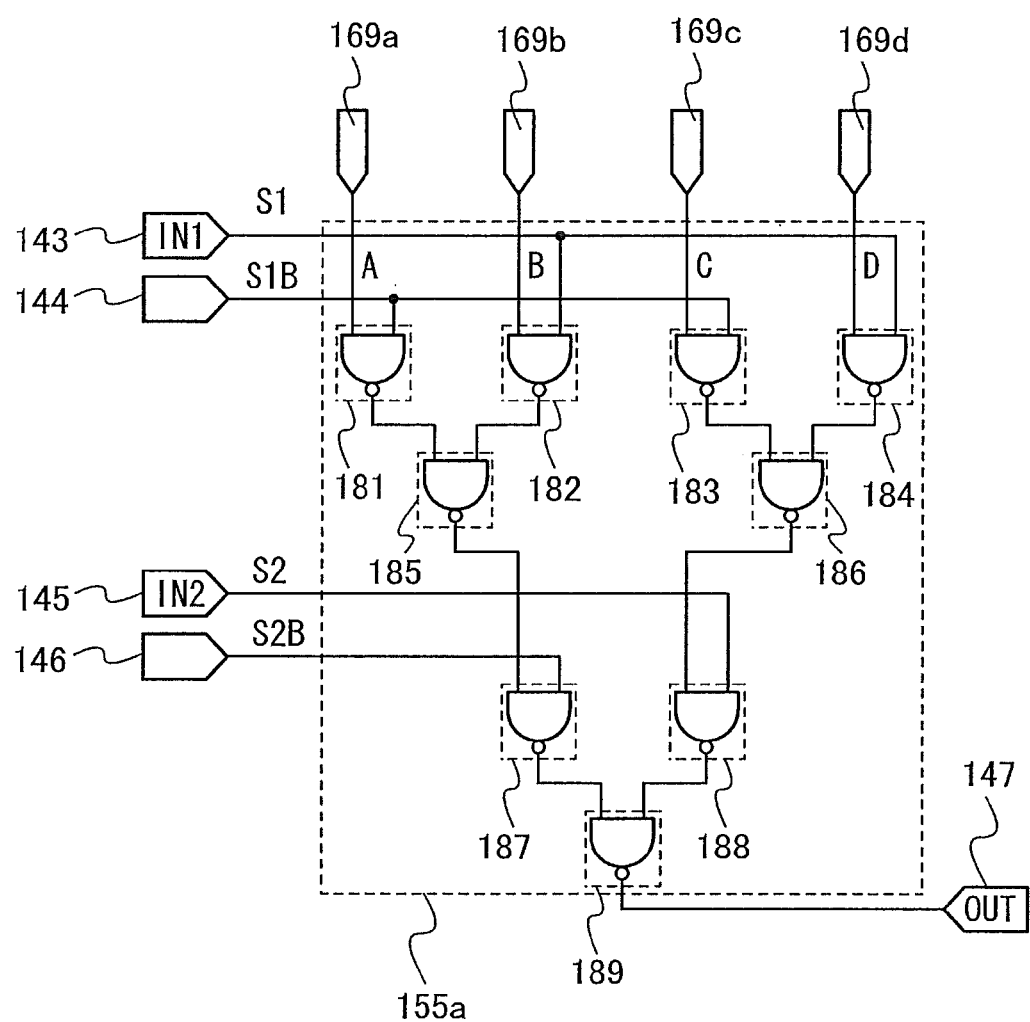
FIG. 5 is a circuit diagram illustrating a selection circuit.

FIG. 5 is a circuit diagram of a multiplexer 155a which can be used as the multiplexer 155 illustrated in FIG. 4A.

The multiplexer 155a illustrated in FIG. 5 includes a first NAND circuit 181 to a ninth NAND circuit 189.

The first NAND circuit 181 is connected to an output terminal 169a of the memory element 141a illustrated in FIG. 4A. The second NAND circuit 182 is connected to an output terminal 169b of the memory element 141b illustrated in FIG. 4A. The third NAND circuit 183 is connected to an output terminal 169c of the memory element 141c illustrated in FIG. 4A. The fourth NAND circuit 184 is connected to an output terminal 169d of the memory element 141d illustrated in FIG. 4A.

Configuration data A is input from the memory element 141a to the first NAND circuit 181. Configuration data B is input from the memory element 141b to the second NAND circuit 182. Configuration data C is input from the memory element 141c to the third NAND circuit 183. Configuration data D is input from the memory element 141d to the fourth NAND circuit 184.

The signal S1 is input from the input terminal 143 to the second NAND circuit 182 and the fourth NAND circuit 184, and the signal S1B input from the input terminal 143 is input to the first NAND circuit 181 and the third NAND circuit 183. Note that the signal S1B is formed by inversion of the signal S1 by the inverter. The operations of the first NAND circuit 181 to the fourth NAND circuit 184 are controlled in the above manner, and one of the configuration data A and B and one of the configuration data C and D are output to the fifth NAND circuit 185 and the sixth NAND circuit 186, respectively. Note that an input terminal 144 is connected to the output terminal of the inverter connected to the input terminal 143.

The fifth NAND circuit 185 is connected to the first NAND circuit 181 and the second NAND circuit 182. The sixth NAND circuit 186 is connected to the third NAND circuit 183 and the fourth NAND circuit 184.

A signal processed in the first NAND circuit 181 and a signal processed in the second NAND circuit 182 are input to the fifth NAND circuit 185, and the signal processed in the fifth NAND circuit 185 is output to the seventh NAND circuit 187. A signal processed in the third NAND circuit 183 and a signal processed in the fourth NAND circuit 184 are input to the sixth NAND circuit 186, and the processed signal is output to the eighth NAND circuit 188.

The seventh NAND circuit 187 is connected to the fifth NAND circuit 185. The eighth NAND circuit 188 is connected to the sixth NAND circuit 186. The signal S2B input to the input terminal 145 is input to the seventh NAND circuit 187. Note that the signal S2B is formed by inversion of the signal S2 by the inverter. The signal S2 is input from the input terminal 145 to the eighth NAND circuit 188. Operations of the seventh NAND circuit 187 and the eighth NAND circuit 188 are controlled in the above manner, and the processed signal is output to the ninth NAND circuit 189. Note that an input terminal 146 is connected to the output terminal of the inverter connected to the input terminal 145.

The ninth NAND circuit 189 is connected to the seventh NAND circuit 187 and the eighth NAND circuit 188.

The ninth NAND circuit 189 is connected to the output terminal 147.

A signal processed in the seventh NAND circuit 187 and a signal processed in the eighth NAND circuit 188 are input to the ninth NAND circuit 189, and a signal processed in the ninth NAND circuit 189 is output to the output terminal 147 in the look-up table.

Through the above steps, configuration data can be output with the use of two input signals.

Figure 6:
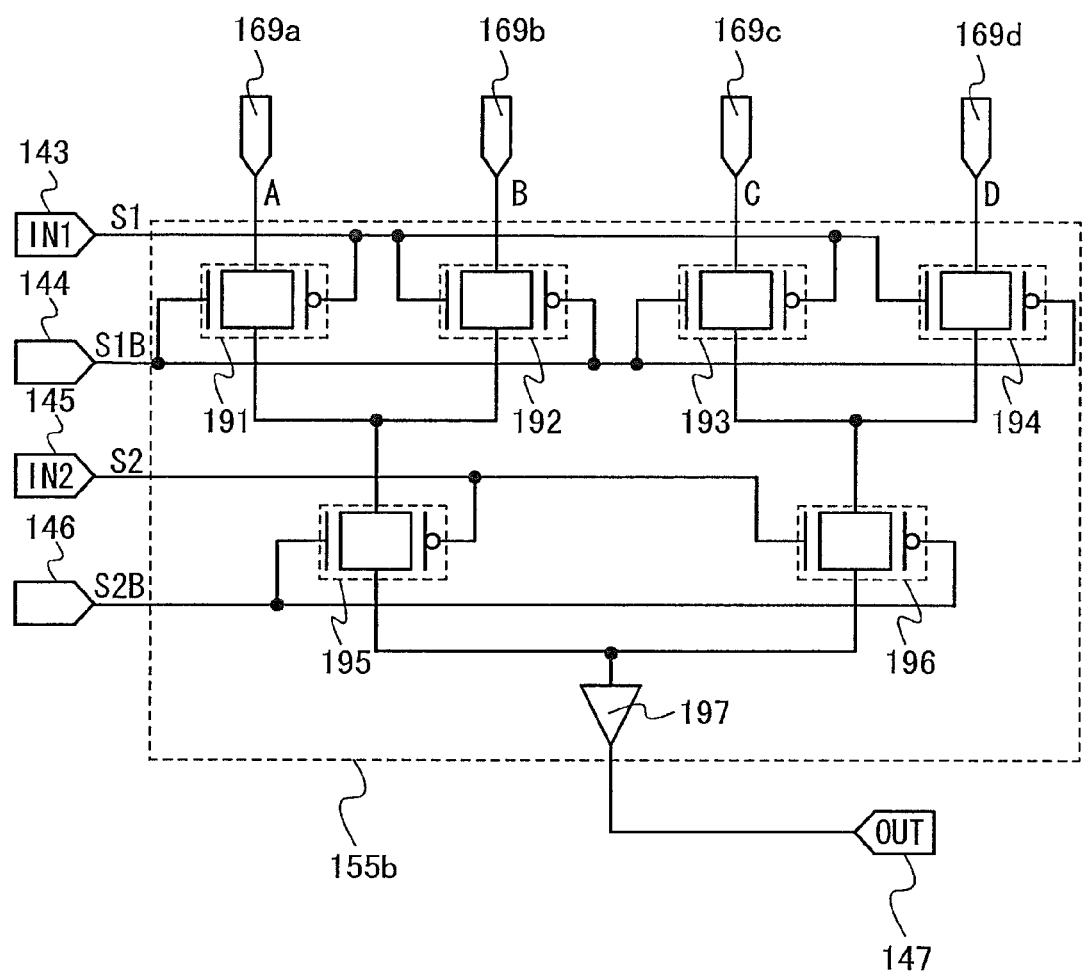
FIG. 6 is a circuit diagram illustrating a selection circuit.

FIG. 6 is a circuit diagram of a multiplexer 155b which can be used as the multiplexer 155 illustrated in FIG. 4A.

The multiplexer 155b illustrated in FIG. 6 includes a buffer 197 and a first transmission gate 191 to a sixth transmission gate 196. In each of the transmission gates, a p-channel transistor and an n-channel transistor are connected in parallel.

The first transmission gate 191 is connected to the output terminal 169a of the memory element 141a. The second transmission gate 192 is connected to the output terminal 169b of the memory element 141b. The third transmission gate 193 is connected to the output terminal 169c of the memory element 141c. The fourth transmission gate 194 is connected to the output terminal 169d of the memory element 141d.

Configuration data A is input from the memory element 141a to the first transmission gate 191. Configuration data B is input from the memory element 141b to the second transmission gate 192. Configuration data C is input from the memory element 141c to the third transmission gate 193. Configuration data D is input from the memory element 141d to the fourth transmission gate 194.

The signal S1 input from the input terminal 143 and the signal S1B are input to the first transmission gate 191 to the fourth transmission gate 194. Note that the signal S1B is formed by inversion of the signal S1 by the inverter. The operations of the first transmission gate 191 to the fourth transmission gate 194 are controlled in the above manner, and one of the configuration data A and B and one of the configuration data C and D are output to the fifth transmission gate 195 and the sixth transmission gate 196, respectively.

The fifth transmission gate 195 is connected to the first transmission gate 191 and the second transmission gate 192. The sixth transmission gate 196 is connected to the third transmission gate 193 and the fourth transmission gate 194.

The buffer 197 is connected to the output terminal 147.

To the n-channel transistors of the fifth transmission gate 195 and the sixth transmission gate 196, the signal S2 is input from the input terminal 145 and the signal S2B is input to control operations of the fifth transmission gate 195 and the sixth transmission gate 196; thus, the processed signal is output to the buffer 197. Note that the signal S2B is formed by inversion of the signal S2 input to the input terminal 145 by the inverter.

An operation method of the multiplexer is described. Here, as one mode, an operation method of the multiplexer 155b illustrated in FIG. 6 is described.

A Low signal is input to the input terminal 143 as the signal S1. Since the signal S1B is an inversion signal of the signal S1, a High signal is input as the signal S1B. A Low signal is input to the input terminal 145 as the signal S2. Since the signal S2B is an inversion signal of the signal S2, a High signal is input through the input terminal 146 as the signal S2B. Note that the input terminal 144 is connected to an output terminal of the inverter connected to the input terminal 143. The input terminal 146 is connected to the output terminal of the inverter connected to the input terminal 145. Arithmetic processing is performed on these signals in the multiplexer 155b, a signal A is output to the buffer 197, and the signal A amplified in the buffer 197 is output from the output terminal 147.

Similarly, when a Low signal is input to the input terminal 143 as the signal S1 and a High signal is input to the input terminal 145 as the signal S2, a signal C is output from the memory element 141c to the buffer 197, and the signal C amplified in the buffer 197 is output from the output terminal 147.

Similarly, when a High signal is input to the input terminal 143 as the signal S1 and a Low signal is input to the input terminal 145 as the signal S2, a signal B is output from the memory element 141b to the buffer 197, and the signal B amplified in the buffer 197 is output from the output terminal 147.

Similarly, when a High signal is input to the input terminal 143 as the signal S1 and a High signal is input to the input terminal 145 as the signal S2, a signal D is output from the memory element 141*d* to the buffer 197, and the signal D amplified in the buffer 197 is output from the output terminal 147.

Any of the configuration data A to D stored in the memory elements included in the configuration memory is output from the selection circuit in this manner in accordance with the signals S1 and S2 input from the input terminals 143 and 145, so that a kind of arithmetic processing performed in the logic element can be specified.

The logic elements 121*a* to 121*d* illustrated in FIG. 2 perform different kinds of arithmetic processing depending on configuration data stored in the configuration memory 133.

Note that the register 137 can be removed from the logic element 121*a* illustrated in FIG. 3. The programmable logic device may include both a logic element having the register 137 and a logic element in which the register 137 is not provided. In the logic element that does not include the register 137, an output of the look-up table 131 can be used as an output of the logic element 121*a*.

This embodiment can be implemented combining with another embodiment as appropriate.

A non-volatile memory element used for the configuration memory 133 does not need regular refresh operation or is subjected to refresh operation at very low frequency; therefore, power consumption can be further reduced. In addition, with the use of the non-volatile element, data is not necessarily written to the configuration memory 133 every time when supply of power supply voltage to the programmable logic device starts. Accordingly, a programmable logic device where power consumption is low and start-up time is short can be provided.

This embodiment can be implemented by being combined as appropriate with any of the above-described embodiments.

Embodiment 2

In this embodiment, a method for manufacturing the programmable logic device described in Embodiment 1 is described with reference to FIG. 7, FIGS. 8A to 8D, FIGS. 9A to 9C, FIGS. 10A to 10C, and FIGS. 11A and 11B. Here, the memory element 141 which has the transistor 161 including an oxide semiconductor film and a buffer functioning as the arithmetic circuit 163 as illustrated in a circuit diagram in FIG. 7 is described as a memory element. Specifically, as a method for manufacturing the programmable logic device, a method for manufacturing the transistor 161 including an oxide semiconductor film and the first n-channel transistor 163*a* and the first p-channel transistor 163*b* which form the buffer is described. Note that in FIGS. 8A to 8D, FIGS. 9A to 9C, FIGS. 10A to 10C, and FIGS. 11A and 11B, cross-sectional views taken along a line A-B each correspond to a cross-sectional view of a region where the transistor 161 including an oxide semiconductor film, the first n-channel transistor 163*a*, and the first p-channel transistor 163*b* are formed, and cross-sectional views taken along a line C-D each correspond to a cross-sectional view of a region where the one of the source and the drain of the transistor 161 including an oxide semiconductor film is connected to the gates of the first n-channel transistor 163*a* and the first p-channel transistor 163*b*.

Figure 8A:
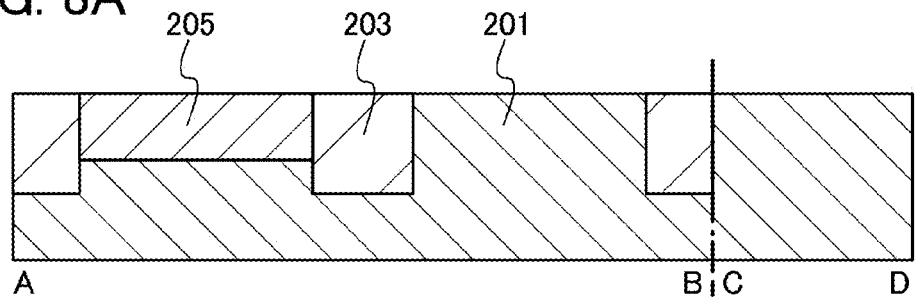
FIGS. 8A to 8D are cross-sectional views illustrating a method for manufacturing a programmable logic device.

As illustrated in FIG. 8A, an element separation region 203 is formed in an n-type semiconductor substrate 201 and then a p-well region 205 is formed in part of the n-type semiconductor substrate 201.

Examples of the n-type semiconductor substrate 201 include a single crystal silicon substrate (a silicon wafer) having n-type conductivity, and a compound semiconductor substrate (e.g., a SiC substrate, a sapphire substrate, or a GaN substrate).

A silicon-on-insulator (SOI) substrate can also be used as the semiconductor substrate instead of the n-type semiconductor substrate 201. Examples of the SOI substrate that can be used as the semiconductor substrate include a so-called SIMOX (separation by implanted oxygen) substrate which is formed in such a manner that after an oxygen ion is implanted into a mirror-polished wafer, an oxide layer is formed at a certain depth from the surface and defects generated in a surface layer are eliminated by high-temperature heating; an SOI substrate formed by the Smart-Cut process in which a semiconductor substrate is cleaved by utilizing growth of a minute void, which is formed by implantation of a hydrogen ion, by heat treatment; and an SOI substrate formed by ELT-RAN (epitaxial layer transfer: a registered trademark of Canon Inc.); or the like.

The element isolation region 203 can be formed by a local oxidation of silicon (LOCOS) method, a shallow trench isolation (STI) method, or the like.

To the p-well region 205, a p-type impurity element such as boron or the like is added at a concentration of about $5 \times 10^{15}/\text{cm}^3$ to $1 \times 10^{16}/\text{cm}^3$. The p-well region 205 is formed in such a manner that a mask is formed over part of the semiconductor substrate 201 and then a p-type impurity element is added to another part of the semiconductor substrate 201.

Note that here, an n-type semiconductor substrate is used, but it is also possible to use a p-type semiconductor substrate. An n-well region may be formed in the p-type semiconductor substrate by addition of an n-type impurity element such as phosphorus or arsenic.

Figure 8B:
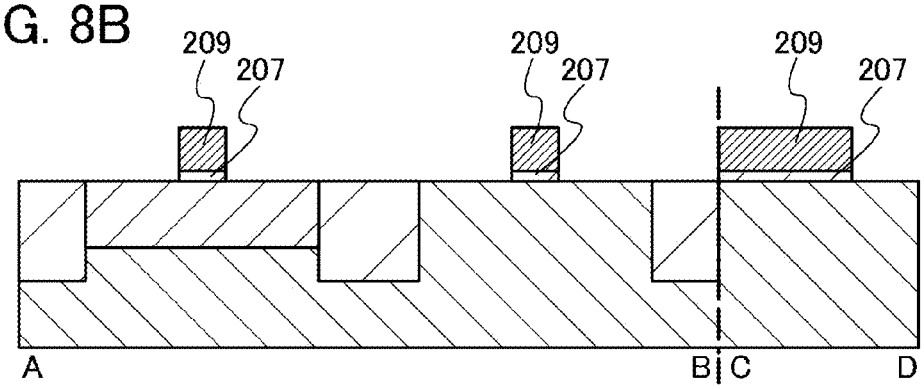

Next, as illustrated in FIG. 8B, a gate insulating film 207 and a gate electrode 209 are formed over the semiconductor substrate 201.

Heat treatment is performed on a surface of the semiconductor substrate 201 to oxidize the surface, whereby a silicon oxide film is formed. Alternatively, each of the first insulating films 216, 218, and 220 can be formed with a stacked structure of a silicon oxide film and a film containing oxygen and nitrogen (silicon oxynitride film) by forming the silicon oxide film using a thermal oxidation method and then nitriding the surface of the silicon oxide film using nitridation treatment. Next, part of the silicon oxide film or the silicon oxynitride film is selectively etched to form the gate insulating film 207.

Alternatively, a 5-to-50-nm-thick film of a silicon oxide; a silicon oxynitride; a metal oxide such as a tantalum oxide, a hafnium oxide, a hafnium silicate oxide, a zirconium oxide, an aluminum oxide, or a titanium oxide; or a rare-earth oxide such as a lanthanum oxide, each of which is a high dielectric constant substance (also referred to as a high-k material), is formed by a CVD method, a sputtering method, or the like; then, part of the film is selectively etched to form the gate insulating film 207.

The gate electrode 209 is preferably formed using a metal selected from metals such as tantalum, tungsten, titanium, molybdenum, chromium, and niobium, or an alloy material or a compound material including any of the metals as its main component. Further, polycrystalline silicon to which an impurity element such as phosphorus is added can be used. Furthermore, the control gate electrode 209 may be formed to have a stacked structure of a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 209 is formed in such a manner that a conductive film is formed by a sputtering method, a CVD method, or the like and then part of the conductive film is selectively etched.

Here, heat treatment is performed to oxidize the surface of the semiconductor substrate 201 and a silicon oxide film is formed. A conductive film which is a stack of a tantalum nitride film and a tungsten film is formed over the silicon oxide film by a sputtering method. After that, part of the silicon oxide film and part of the conductive film are selectively etched. Thus, the gate insulating film 207 and the gate electrode 209 are formed.

Figure 8C:
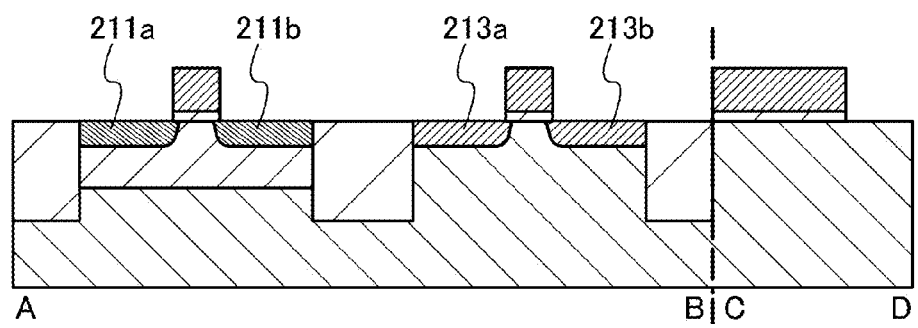

Next as illustrated in FIG. 8C, a p-type impurity element is added to the semiconductor substrate 201 to form p-type impurity regions 213a and 213b. Further, an n-type impurity element is added to the p-well region 205 to form n-type impurity regions 211a and 211b. The concentration of an n-type impurity element in the n-type impurity regions 211a and 211b is $1\times10^{19}/cm^3$ to $1\times10^{21}/cm^3$ and the concentration of a p-type impurity element in the p-type impurity regions 213a and 213b is $1\times10^{19}/cm^3$ to $1\times10^{21}/cm^3$. An n-type impurity element and a p-type impurity element are added to the semiconductor substrate 201 and the p-well region 205 by an ion-doping method, an ion implantation method, or the like as appropriate.

Figure 8D:
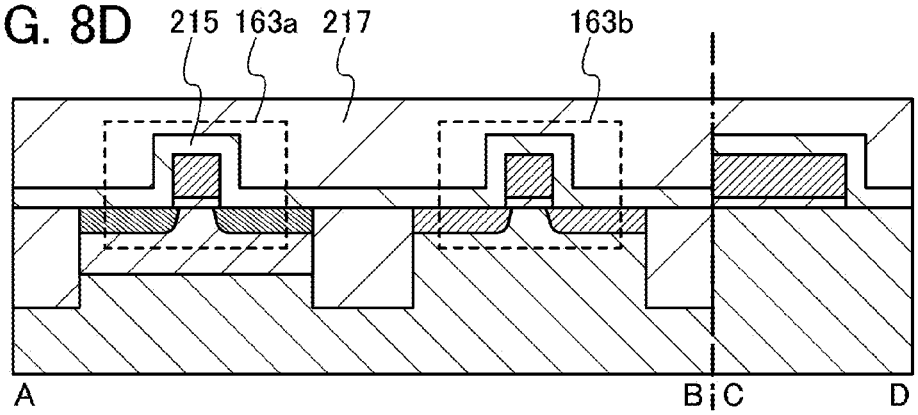

Next, as illustrated in FIG. 8D, insulating films 215 and 217 are formed over the semiconductor substrate 201, the element separation region 203, the gate insulating film 207, and the gate electrode 209 by a sputtering method, a CVD method, or the like.

The insulating films 215 and 217 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 becomes higher, which makes it possible to hydrogenate the semiconductor substrate by a heat treatment, so that a dangling bond can be terminated by hydrogen and defects can be reduced.

Note that planarity of the insulating film 217 can be high when the insulating film 217 is formed using an inorganic material such as boron phosphorus silicon glass (BPSG), or an organic material such as polyimide or acrylic.

After the insulating film 215 or the insulating film 217 is formed, heat treatment is performed to activate the impurity elements added to the impurity regions 211a, 211b, 213a, and 213b.

Figure 7:
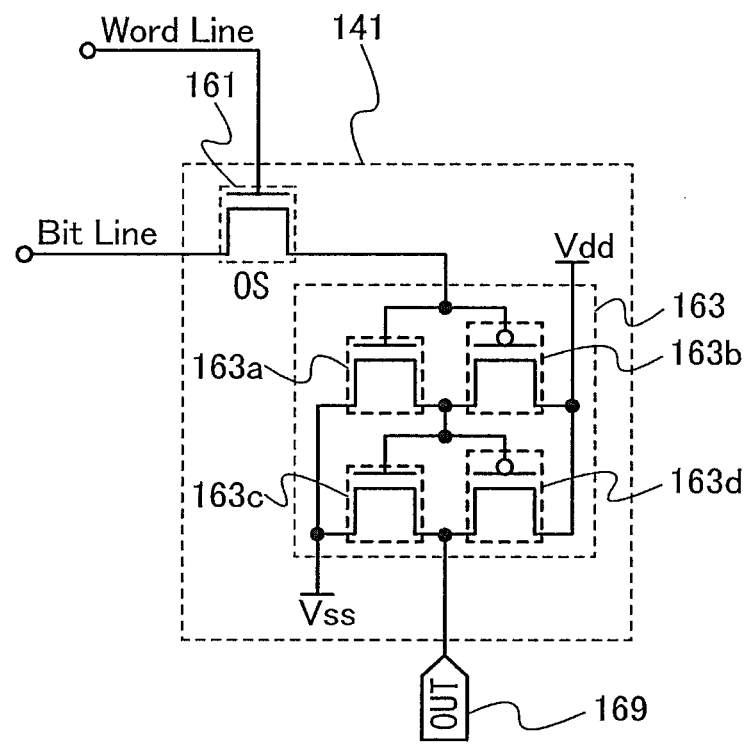
FIG. 7 is a circuit diagram illustrating a memory element.

Through the above steps, the n-channel transistor 163a and the p-channel transistor 163b illustrated in FIG. 7 are manufactured.

Next, parts of the insulating films 215 and 217 are selectively etched to form openings. Then, contact plugs 219a to 219d are formed in the openings. Typically, a conductive film is formed by a sputtering method, a CVD method, a plating method, or the like, and then planarization treatment is performed by a chemical mechanical polishing (CMP) method to remove unnecessary part of the surface of the conductive film; thus, the contact plugs 219a to 219d are formed.

As the conductive film to be the contact plugs 219a to 219d, tungsten silicide is formed by a CVD method using a $WF_6$ gas and a $SiH_4$ gas to fill the openings.

Next, an insulating film is formed over the insulating film 217 and the contact plugs 219a to 219d by a sputtering method, a CVD method, or the like and then part of the insulating film is selectively etched to have grooves, whereby insulating films 221a to 221e are formed. Subsequently, a conductive film is formed by a sputtering method, a CVD method, or the like, and then, planarization treatment is performed by a CMP method, a plating method, or the like to remove unnecessary part of the surface of the conductive film; thus, wirings 223a to 223c are formed (see FIG. 9A).

The insulating films 221a to 221e can be formed using a material similar to the insulating film 215.

Each of the wirings 223a to 223c is formed to have a single-layer structure or a stacked-layer structure including, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

With the use of the planarized insulating films 221a to 221e and the planarized wirings 223a to 223c, variation in electrical characteristics of a transistor including an oxide semiconductor film which is formed later can be reduced. Further, a transistor including an oxide semiconductor film can be formed in high yield.

Note that hydrogen contained in the insulating films 221a to 221e and the wirings 223a to 223c is preferably desorbed by heat treatment or plasma treatment. Consequently, in heat treatment performed later, diffusion of hydrogen to an insulating film and an oxide semiconductor film which are formed later can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used.

Next, an insulating film 225 is formed over the insulating films 221a to 221e and the wirings 223a to 223c by a sputtering method, a CVD method, or the like. The insulating film 225 can be formed with a single layer or a stacked layer using one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which some contained oxygen is desorbed by heating. The oxide insulating film from which part of oxygen is eliminated by heating is an oxide insulating film which contains oxygen at a proportion exceeding the stoichiometric proportion. The oxide insulating film from which part of oxygen is released by heat treatment can diffuse oxygen into the oxide semiconductor film by heat treatment, because oxygen is released from the oxide insulating film by heat treatment.

Figure 9A:
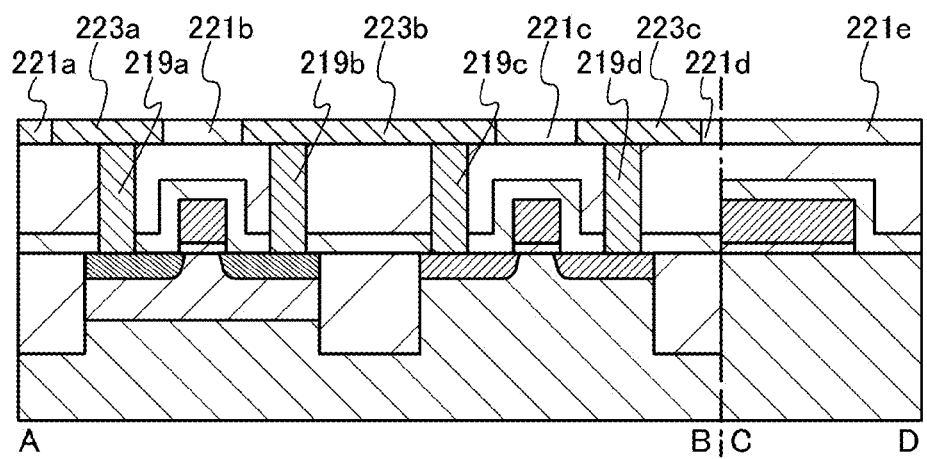
FIGS. 9A to 9C are cross-sectional views illustrating a method for manufacturing a programmable logic device.
Figure 9B:
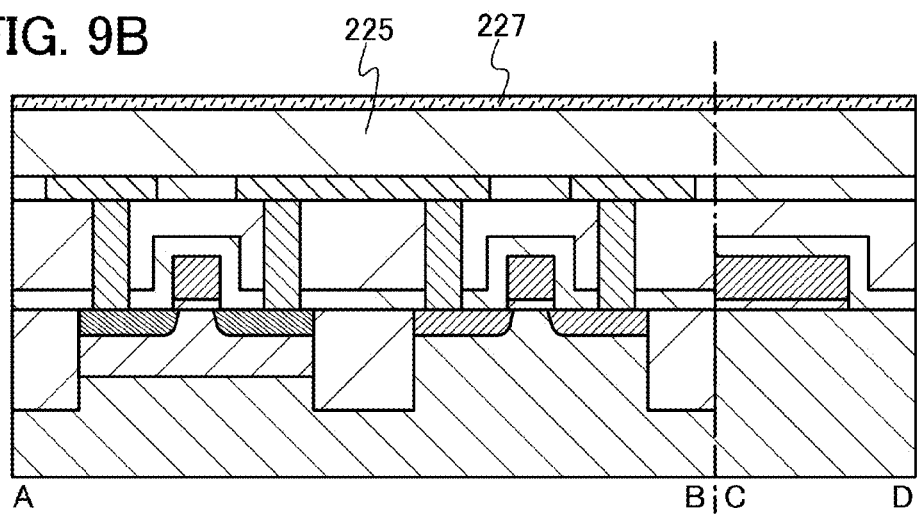
Figure 9C:
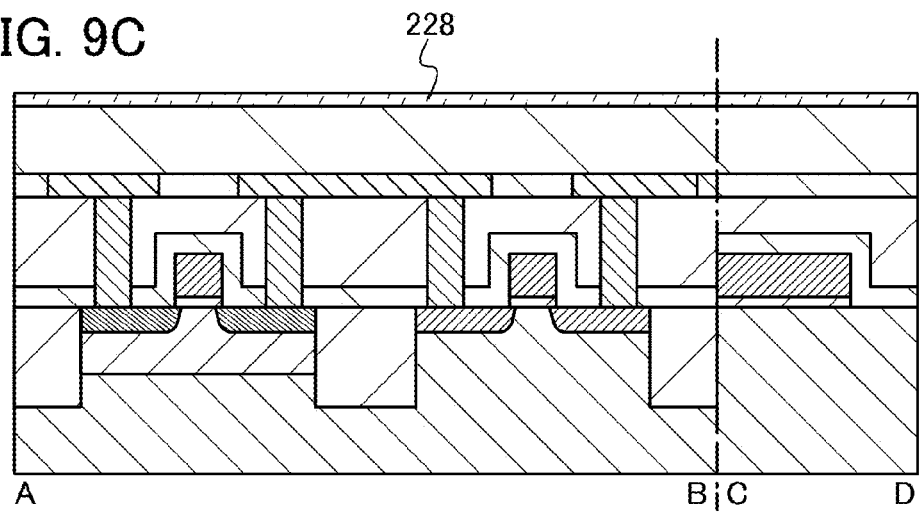

Next, an oxide semiconductor film 227 is formed over the insulating film 225 by a sputtering method, a coating method, a printing method, a pulsed laser deposition method, or the like (see FIG. 9B). Here, the oxide semiconductor film 227 is formed by a sputtering method to have a thickness more than or equal to 1 nm and less than or equal to 50 nm, preferably more than or equal to 3 nm and less than or equal to 30 nm. When the oxide semiconductor film 227 has a thickness in the above range, a short-channel effect of the transistor can be suppressed.

An oxide semiconductor used for the oxide semiconductor film preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of a lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: a single component metal oxide such as indium oxide, tin oxide, or zinc oxide, a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide, a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide, or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

The oxide semiconductor film 227 is an oxide semiconductor film containing at least one kind of element selected from In, Ga, Sn, and Zn. Typically, a four-component metal oxide such as an In—Sn—Ga—Zn-based metal oxide; a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide; a two-component metal oxide such as an In—Zn-based metal oxide or a Sn—Zn-based metal oxide; a one-component metal oxide such as indium oxide, tin oxide, or zinc oxide; or the like can be used for the oxide semiconductor film 227. Moreover, silicon oxide may be contained in the above oxide semiconductor.

Here, for example, an In—Ga—Zn-based material means an oxide containing indium (In), gallium (Ga), and zinc (Zn), and there is no particular limitation on the composition ratio. The In—Ga—Zn-based material may further contain an element other than indium, gallium, and zinc. Here, the amount of oxygen in the above oxide semiconductor film preferably exceeds the stoichiometric proportion of oxygen. When the amount of oxygen exceeds the stoichiometric proportion, generation of carriers which results from oxygen vacancies in the oxide semiconductor film can be suppressed.

For the oxide semiconductor film, a material expressed as the chemical formula $InMO_3(ZnO)_m$ (m>0, m is not an integer) may be used. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based metal oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as field-effect mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based metal oxide, a high field-effect mobility can be relatively easily obtained. However, the field-effect mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high field-effect mobility can be obtained with relative ease.

In a crystalline oxide semiconductor, defects in the bulk can be further reduced and when a surface flatness is improved, field-effect mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm. Note that $R_a$ can be measured using an atomic force microscope (AFM).

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \quad \text{[Formula 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

In the case where an In—Zn-based metal oxide is used as the oxide semiconductor film, the atomic ratio thereof is In/Zn=0.5 to 50, preferably In/Zn=1 to 20, more preferably In/Zn=1.5 to 15. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

Note that the energy gap of a metal oxide which can form the oxide semiconductor film 227 is greater than or equal to 2 eV, preferably greater than or equal to 2.5 eV, more preferably greater than or equal to 3 eV. In this manner, the off-state current of a transistor can be reduced with the use of an oxide semiconductor having a wide energy gap.

Note that the concentration of alkali metals or alkaline earth metals in the oxide semiconductor film 227 is preferably lower than or equal to $1 \times 10^{18}$ atoms/cm$^3$, further preferably lower than or equal to $2 \times 10^{16}$ atoms/cm$^3$. When an alkali metal or an alkaline earth metal is bonded to an oxide semiconductor, carriers are generated in some cases, which causes an increase in the off-state current of the transistor.

The oxide semiconductor film 227 may contain nitrogen at a concentration of lower than or equal to $5 \times 10^{18}$ atoms/cm$^3$.

The oxide semiconductor film 227 may have an amorphous structure.

As the oxide semiconductor film 227, a c-axis aligned crystalline oxide semiconductor (CAAC-OS) film including crystallized parts may be used.

A CAAC-OS will be described below. A CAAC-OS is an oxide semiconductor including a crystal with c-axis alignment which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis.

In a broad sense, a CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner in a cross section in the c-axis direction.

The CAAC-OS is not a single crystal oxide semiconductor, but this does not mean that the CAAC-OS is composed of only an amorphous component. Although the CAAC-OS includes a crystallized portion (crystalline portion), a boundary between one crystalline portion and another crystalline portion is not clear in some cases.

In the case where the CAAC-OS includes oxygen, nitrogen may be substituted for part of oxygen included in the CAAC-OS. The c-axes of individual crystalline portions included in CAAC-OS may be aligned in one direction (e.g., a direction perpendicular to the substrate surface or the surface, interface, or the like of the CAAC-OS). Alternatively, the normals of the a-b planes of the individual crystalline portions included in the CAAC-OS may be aligned in one direction (e.g., a direction perpendicular to the substrate surface or the surface, interface, or the like of the CAAC-OS).

A CAAC-OS becomes a conductor, a semiconductor, or an insulator depending on its composition or the like. The CAAC-OS transmits or does not transmit visible light depending on its composition or the like.

An example of such a CAAC-OS is an oxide semiconductor which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC-OS will be described in detail with reference to FIGS. 14A to 14E, FIGS. 15A to 15C, and FIGS. 16A to 16C. In FIGS. 14A to 14E, FIGS. 15A to 15C, and FIGS. 16A to 16C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 14A to 14E, O surrounded by a circle represents tetracoordinate O and O surrounded by a double circle represents tricoordinate O.

Figure 14A:
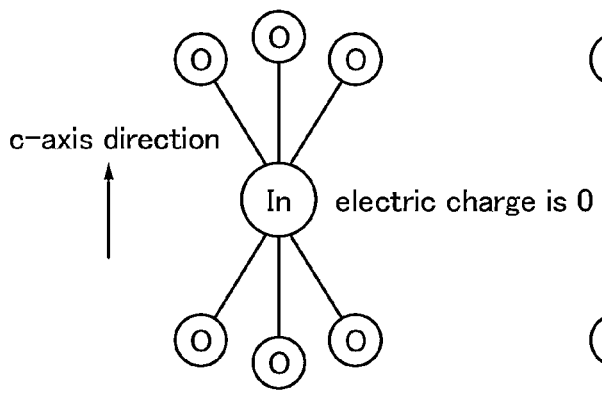
FIGS. 14A to 14E are views each illustrating a crystal structure of an oxide material.

FIG. 14A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 14A is actually an octahedral structure, but is illustrated as a planar structure for simplicity. Note that three tetracoordinate O atoms exist in each of an upper half and a lower half in FIG. 14A. In the small group illustrated in FIG. 14A, electric charge is 0.

Figure 14D:
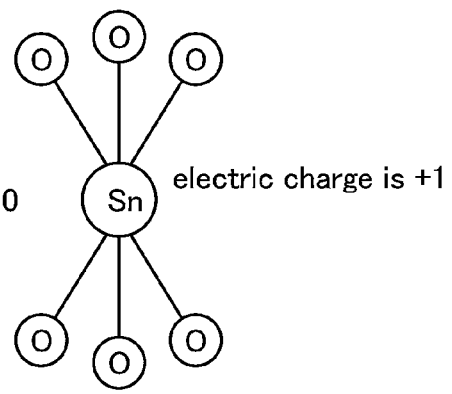
Figure 14B:
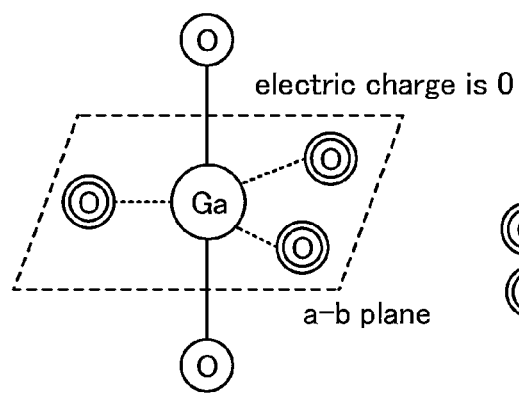

FIG. 14B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 14B. An In atom can also have the structure illustrated in FIG. 14B because an In atom can have five ligands. In the small group illustrated in FIG. 14B, electric charge is 0.

Figure 14E:
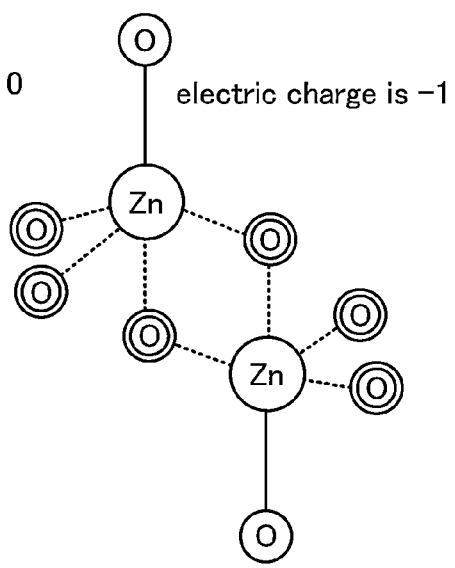
Figure 14C:
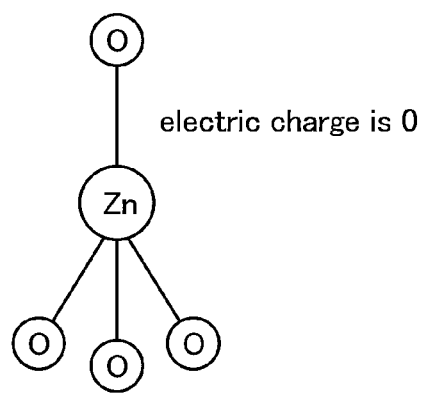

FIG. 14C illustrates a structure including one tetracoordinate Zn atom and four tetracoordinate O atoms proximate to the Zn atom. In FIG. 14C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 14C. In the small group illustrated in FIG. 14C, electric charge is 0.

FIG. 14D illustrates a structure including one hexacoordinate Sn atom and six tetracoordinate O atoms proximate to the Sn atom. In FIG. 14D, three tetracoordinate O atoms exist in each of an upper half and a lower half. In the small group illustrated in FIG. 14D, electric charge is +1.

FIG. 14E illustrates a small group including two Zn atoms. In FIG. 14E, one tetracoordinate O atom exists in each of an upper half and a lower half. In the small group illustrated in FIG. 14E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 14A each have three proximate In atoms in the downward direction, and the three O atoms in the lower half each have three proximate In atoms in the upward direction. The one O atom in the upper half with respect to the pentacoordinate Ga atom in FIG. 14B has one proximate Ga atom in the downward direction, and the one O atom in the lower half has one proximate Ga atom in the upward direction. The one O atom in the upper half with respect to the tetracoordinate Zn atom in FIG. 14C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 15A illustrates a model of a medium group included in a layered structure of an In—Sn—Zn—O-based material. FIG. 15B illustrates a large group including three medium groups. Note that FIG. 15C illustrates an atomic arrangement in the case where the layered structure in FIG. 15B is observed from the c-axis direction.

In FIG. 15A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 15A, one tetracoordinate O atom existing in each of an upper half and a lower half with respect to an In atom is denoted by circled 1. FIG. 15A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 15A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 14E can be given. For example, with one small group including two Zn atoms, electric charge of one small group including a Sn atom can be cancelled, so that the total electric charge of the layered structure can be 0.

When the large group illustrated in FIG. 15B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_2(ZnO)_m$ (m is 0 or a natural number).

The above-described rule also applies to the following oxides: a four-component metal oxide such as an In—Sn—Ga—Zn-based metal oxide; a three-component metal oxide such as an In—Ga—Zn-based metal oxide (also referred to as IGZO), an In—Al—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; one-component metal oxide such as indium oxide, tin oxide, and zinc oxide; and the like.

Figure 16A:
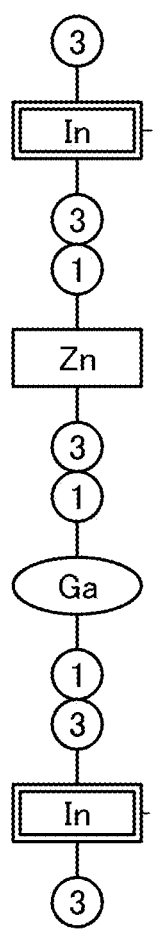

As an example, FIG. 16A illustrates a model of a medium group included in a layered structure of an In—Ga—Zn—O-based material.

In the medium group included in the layered structure of the In—Ga—Zn—O-based material in FIG. 16A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 16B:
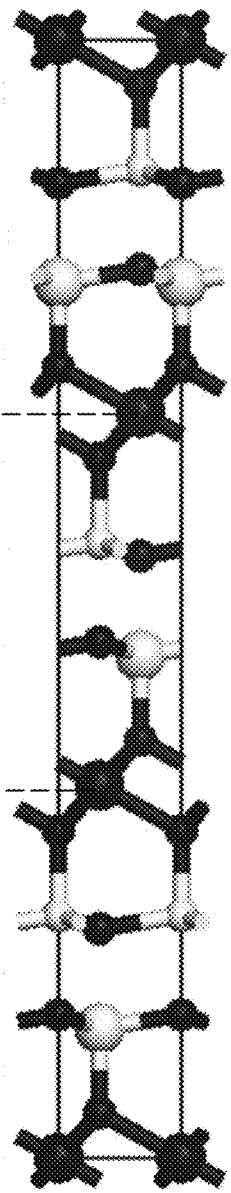

FIG. 16B illustrates a large group including three medium groups. Note that FIG. 16C illustrates an atomic arrangement in the case where the layered structure in FIG. 16B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 16A but also a medium group in which the arrangement of the In atom, the Ga atom, and the Zn atom is different from that in FIG. 16A.

Here, as the oxide semiconductor film 227, an amorphous oxide semiconductor film is formed by sputtering.

As a target of the sputtering, metal oxide target containing zinc can be used. As the target, a four-component metal oxide such as an In—Sn—Ga—Zn-based metal oxide, a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, a two-component metal oxide such as an In—Zn-based metal oxide or a Sn—Zn-based metal oxide, or a one-component metal oxide such as a tin oxide or a zinc oxide can be used.

For an In—Sn—Zn-based oxide, a metal oxide target which has a composition ratio of In:Sn:Zn=1:2:2, 2:1:3, 1:1:1, 20:45:35, or the like in atomic ratio is used.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Alternatively, a target having a composition ratio of $In_2O_3:ZnO=25:1$ to 1:4 [molar ratio] can be used.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities containing hydrogen are removed be used as a sputtering gas.

In a sputtering method, an RF power supply device, an AC power supply device, a DC power supply device, or the like can be used as a power supply device for generating plasma as appropriate.

Note that the leakage rate of a treatment chamber in which the oxide semiconductor film is formed is preferably lower than or equal to $1\times10^{-10}$ Pa×m³/sec., whereby entry of an impurity into the film to be formed by a sputtering method can be decreased.

Evacuation of the treatment chamber for deposition of the oxide semiconductor film is preferably performed with rough vacuum pumps such as a dry pump and high vacuum pumps such as a sputter ion pump, a turbo molecular pump, and a cryopump in appropriate combination. The turbo molecular pump has an outstanding capability in evacuating a large-sized molecule, whereas it has a low capability in evacuating hydrogen or water. Hence, for example, it is effective to combine a dry pump and a turbo molecular pump with a cryopump having a high capability in evacuating water or a sputter ion pump having a high capability in evacuating hydrogen.

An adsorbate present at the inner wall of the treatment chamber for deposition of the oxide semiconductor film does not affect the pressure in the deposition chamber because it is adsorbed on the inner wall, but the adsorbate leads to release of gas at the time of the evacuation of the deposition chamber. Therefore, although the leakage rate and the evacuation rate do not have a correlation, it is important that the adsorbate present in the film formation chamber be desorbed as much as possible and evacuation be performed in advance with use of a pump having high evacuation capability. Note that the film formation chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

Note that before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Hydrogen contained in the oxide semiconductor is reacted with oxygen bonded to a metal atom to be water, and in addition, a vacancy is formed in a lattice from which oxygen is eliminated (or a portion from which oxygen is removed). Thus, the impurities containing hydrogen are reduced as much as possible in the formation step of the oxide semiconductor film, whereby vacancies in the oxide semiconductor film can be reduced. Therefore, when a channel region is formed in an oxide semiconductor film which is purified by removing impurities as much as possible, the transistor can have higher reliability.

Next, hydrogen is released from the oxide semiconductor film 227 and part of oxygen contained in the insulating film 225 is diffused into the oxide semiconductor film and the vicinity of the interface between the insulating film 225 and the oxide semiconductor film. As a result, in the transistor to be formed later, an oxide semiconductor film 228 can be formed to have low hydrogen concentration and reduced oxide defects in the vicinity of the interface with the insulating film 225 (see FIG. 9C).

The temperature of the heat treatment is preferably a temperature at which hydrogen is released from the oxide semiconductor film 227 and part of oxygen contained in the insulating film 225 is released and diffused into the oxide semiconductor film 227. The temperature is typically higher than or equal to 150° C. and lower than the strain point of the substrate, preferably higher than or equal to 250° C. and lower than or equal to 450° C., further preferably higher than or equal to 300° C. and lower than or equal to 450° C.

A rapid thermal annealing (RTA) apparatus can be used for the heat treatment. With the use of an RTA apparatus, the heat treatment can be performed at a temperature of higher than or equal to the strain point of the substrate if the heating time is short. Thus, the time during which hydrogen is released from the oxide semiconductor film and the time during which oxygen is diffused from the insulating film 225 to the oxide semiconductor film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere. The treatment time is 3 minutes to 24 hours. Alternatively, heat treatment may be performed in an inert gas atmosphere and then performed in an oxygen atmosphere.

Next, part of the oxide semiconductor film 228 is selectively etched to form an oxide semiconductor film 229. Then, an insulating film 231 is formed by a sputtering method, a CVD method, or the like over the oxide semiconductor film 229. Next, a gate electrode 233 is formed over the insulating film 231 (see FIG. 10A).

The insulating film 231 may be formed to have a single layer or a stack using, for example, one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is eliminated by heating as described as a film that can be used as the insulating film 225. With the use of a film from which oxygen is eliminated by heating as the insulating film 231, oxygen vacancies formed in the oxide semiconductor film 229 can be reduced by heat treatment performed later and deterioration in electric characteristics of the transistor can be suppressed.

The insulating film 231 is formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, whereby a gate leakage current can be decreased even when the thickness of the gate insulating film is small.

The thickness of the insulating film 231 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The gate electrode 233 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate electrode 233 is formed by a printing method or an inkjet method. Alternatively, a conductive film is formed by a sputtering method, a CVD method, an evaporation method, or the like and then part of the conductive film is selectively etched to form the gate electrode 233.

Further, as a material layer in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably provided between the gate electrode 233 and the insulating film 231. These films each have a work function of 5 eV or higher, preferably 5.5 eV or higher; thus, the threshold voltage of the electric characteristics of the transistor can be positive. Accordingly, a so-called normally-off switching element can be obtained. For example, in the case where an In—Ga—Zn—O film containing nitrogen is used, an In—Ga—Zn—O film in which the nitrogen concentration higher than at least that of the oxide semiconductor film 229, specifically an In—Ga—Zn—O film in which the nitrogen concentration is higher than or equal to 7 atomic % is used.

Heat treatment is preferably performed after that. By the heat treatment, oxygen is diffused from the insulating film 225 and the insulating film 231 to the oxide semiconductor film 229, and oxygen deficiency of the oxide semiconductor film 229 is compensated; as a result oxygen deficiency can be reduced.

Figure 10A:
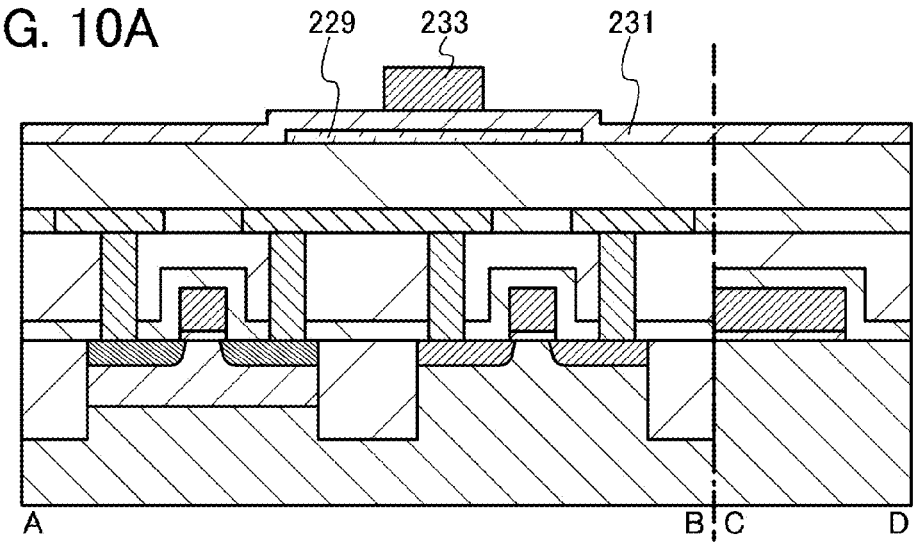
FIGS. 10A to 10C are cross-sectional views illustrating a method for manufacturing a programmable logic device.
Figure 10B:
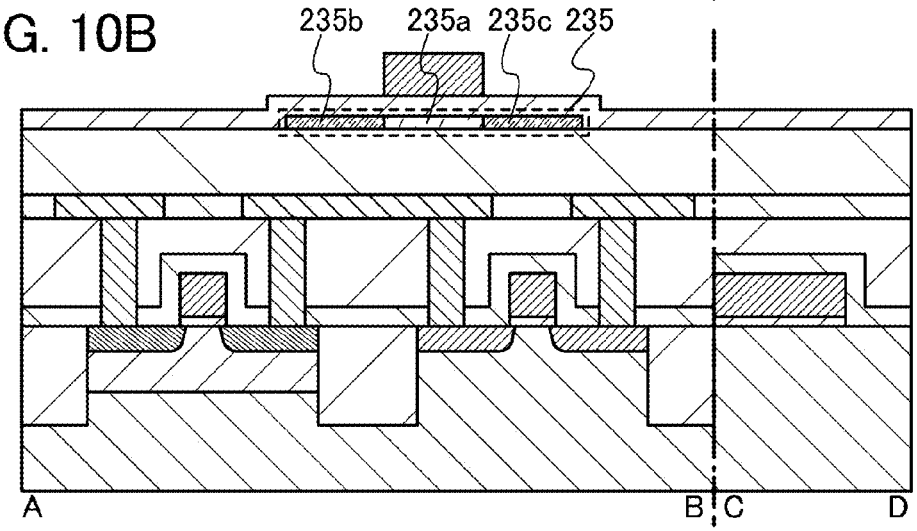

Next, a dopant is added to the oxide semiconductor film 229 with the use of the gate electrode 233 as a mask. Consequently, as illustrated in FIG. 10B, a first region 235a to which the dopant is not added because the region is covered by the gate electrode 233 and a pair of second regions 235b and 235c which including the dopant are formed. Since the dopant is added with the use of the gate electrode 233 as a mask, the first region 235a to which the dopant is not added and the pair of second regions 235b and 235c including the dopant can be formed in a self-alignment manner. Note that the first region 235a overlapping with the gate electrode 233 serves as a channel region. The pair of second regions 235b and 235c including the dopant serve as low-resistance regions. The pair of second regions 235b and 235c including the dopant and the first region 235a are collectively shown as an oxide semiconductor film 235.

Further, the concentration of hydrogen in the first region 235a of the oxide semiconductor film 229 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$. By a bond of an oxide semiconductor and hydrogen, part of contained hydrogen serves as a donor to generate electrons as carriers. For that reason, by the reduction in the concentration of hydrogen in the first region 235a of the oxide semiconductor film 229, negative shift of the threshold voltage can be reduced.

The concentration of the dopant in each of the pair of second regions 235b and 235c is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{19}$ atoms/cm$^3$.

Since the pair of second regions 235b and 235c include the dopant, the carrier density or the number of defects can be increased. Therefore, the conductivity can be higher than that of the first region 235a which does not include a dopant. Note that an excessive increase in the dopant concentration causes inhibition of carrier movement by the dopant, which leads to lower conductivity of the pair of second regions 235b and 235c including the dopant.

The pair of second regions 235b and 235c including the dopant preferably have a conductivity of higher than or equal to 0.1 S/cm and lower than or equal to 1000 S/cm, preferably higher than or equal to 10 S/cm and lower than or equal to 1000 S/cm.

The oxide semiconductor film 229 has the pair of second regions 235b and 235c including the dopant, whereby an electric field applied to the end portion of the first region 235a serving as the channel region can be relaxed. Thus, a short-channel effect of the transistor can be prevented.

As a method for adding the dopant to the oxide semiconductor film 229, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Alternatively, as the dopant, hydrogen can be added. Still alternatively, as the dopant, at least one of boron, nitrogen, phosphorus, and arsenic and at least one of helium, neon, argon, krypton, and xenon in appropriate combination with hydrogen can be added.

In the embodiment describe here, the addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Alternatively, the dopant can be added by a method other than an ion doping method, an ion implantation method, or the like. For example, a dopant can be added in the following manner: plasma is generated in an atmosphere of a gas containing an element to be added and plasma treatment is performed on an object to which the dopant is added. As an apparatus for generating plasma, a dry etching apparatus, a CVD apparatus or the like can be used.

After that, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

By the heat treatment, the resistances of the pair of second regions 235b and 235c including the dopant can be reduced. In the heat treatment, the pair of second regions 235b and 235c including the dopant may be in either a crystalline state or an amorphous state.

Figure 10C:
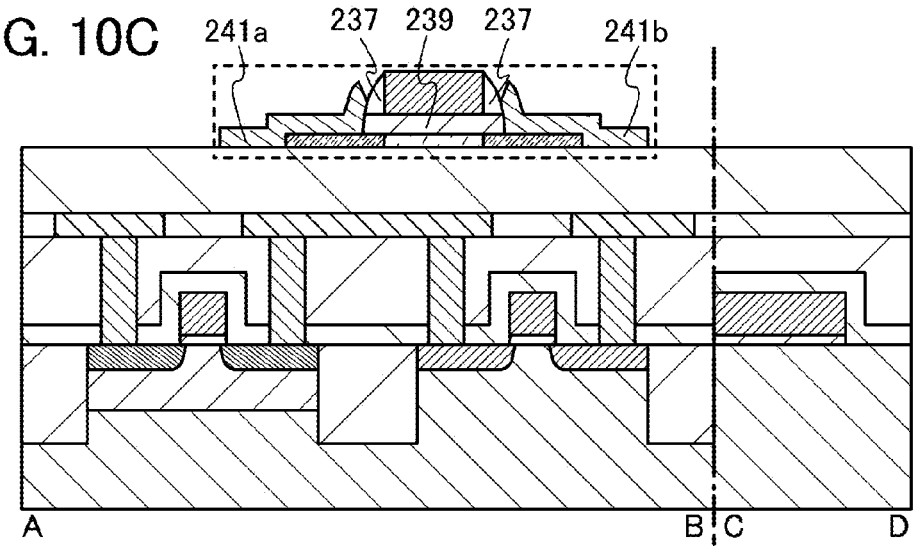

Next, as illustrated in FIG. 10C, a sidewall insulating films 237 on the sides of the gate electrode 233, a gate insulating film 239, and electrodes 241a and 241b are formed.

The sidewall insulating film 237 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. The sidewall insulating film 237 may be formed using an oxide insulating film from which part of oxygen is released by heating in a manner similar to that of the insulating film 225.

Here, a method for forming the sidewall insulating film 237 is described.

First, an insulating film to be the sidewall insulating film 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

The insulating film is etched to form the sidewall insulating film 237. The etching here is highly anisotropic etching, and the sidewall insulating film 237 can be formed in a self-aligned manner by performing the highly anisotropic etching on the insulating film.

Source-drain breakdown voltage can be increased by formation of regions in the pair of second regions 235b and 235c including the dopant. The regions overlap with the sidewall insulating films 237 and the gate insulating film 239. The width of each of the regions which can improve the source-drain breakdown voltage corresponds to the width of the sidewall insulating film 237. The width of the sidewall insulating film 237 also corresponds to the thickness of the gate electrode 233. Therefore, the thickness of the gate electrode 233 can be determined in order that the range of the region which can improve the source-drain breakdown voltage may be a desired range.

When the sidewall insulating films 237 are formed, the insulating film 231 is also etched by highly anisotropic etching and the oxide semiconductor film 229 is partly exposed, whereby the gate insulating film 239 is formed.

The pair of electrodes 241a and 241b can be formed using a material similar to the wirings 223a to 223c as appropriate. Note that the pair of electrodes 241a and 241b may function as wirings.

The pair of electrodes 241a and 241b are formed by a printing method or an inkjet method. Alternatively, a conductive film is formed by a sputtering method, a CVD method, an evaporation method, or the like, and then part of the conductive film is selectively etched, whereby the pair of electrodes 241a and 241b are formed.

The pair of electrodes 241a and 241b are preferably formed to be in contact with the sides of the sidewall insulating films 237 and the gate insulating film 239. That is, it is preferable that the end portions of the pair of electrodes 241a and 241b of the transistor be on the sidewall insulating films 237 and cover entire exposed part of the pair of second regions 235b and 235c including the dopant in the oxide semiconductor film 229. Consequently, regions of the pair of second regions 235b and 235c including the dopant which are in contact with the pair of electrodes 241a and 241b respectively function as a source region and a drain region. In addition, regions of the pair of second regions 235b and 235c including the dopant which overlap with the sidewall insulating films 237 and the gate insulating film 239 can improve source-drain breakdown voltage. Since a distance between a source and a drain depends on the length of the sidewall insulating film 237, channel-side end portions of the pair of electrodes 241a and 241b in contact with the oxide semiconductor film 235 can be formed without masks. Further, because a mask is not used, variation of a plurality of transistors due to process can be reduced.

Through the above steps, the transistor 161 including an oxide semiconductor film can be formed.

Figure 11A:
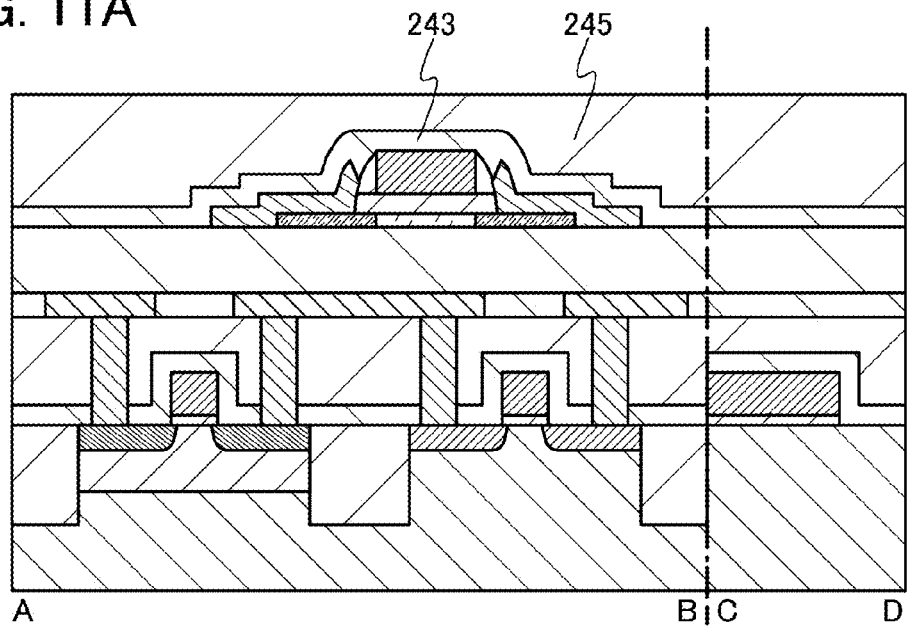
FIGS. 11A and 11B are cross-sectional views illustrating a method for manufacturing a programmable logic device.
Figure 11B:
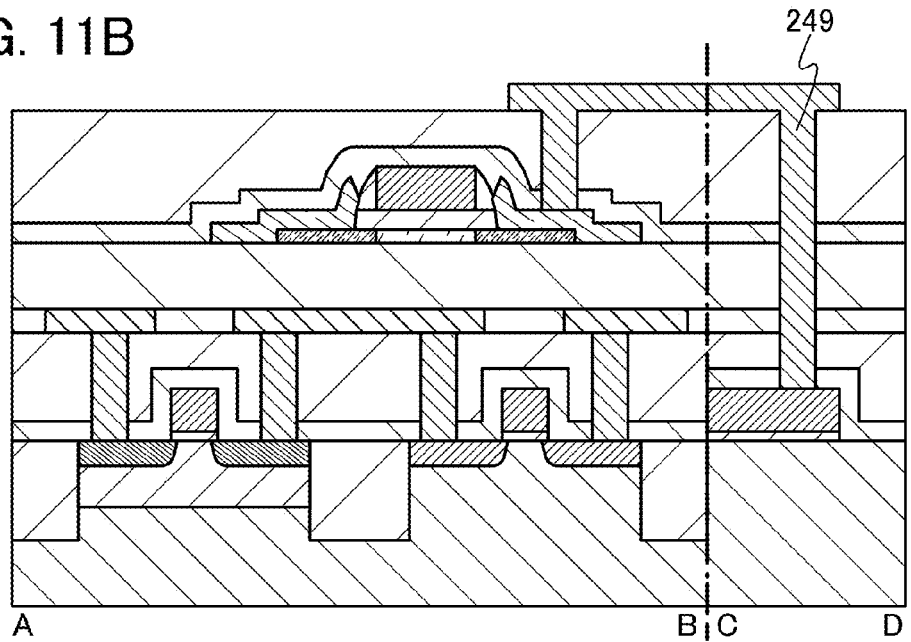

Next, an insulating film 243 and an insulating film 245 are formed, as illustrated in FIG. 11A, by a sputtering method, a CVD method, a coating method, a printing method, or the like.

The insulating films 243 and 245 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. Note that with the use of an insulating film which prevents diffusion of oxygen to the outside as the insulating film 245, oxygen released from the insulating film 243 can be supplied to an oxide semiconductor film. A typical example of the insulating film which prevents diffusion of oxygen to the outside is a film of aluminum oxide, aluminum oxynitride, or the like. In addition, with the use of an oxide insulating film which prevents diffusion of hydrogen from the outside as the insulating film 245, diffusion of hydrogen from the outside to the oxide semiconductor film can be reduced, and vacancies in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three layer structure of an oxide insulating film from which part of oxygen is released by heating, similar to the insulating film 225; an insulating film which prevents diffusion of hydrogen to the outside; and an oxide insulating film, oxygen is efficiently diffused into the oxide semiconductor film and oxygen can be prevented from being released to the outside. Therefore, variation in characteristic of a transistor can be reduced even when temperature and humidity are high.

Through the above steps, a transistor including an oxide semiconductor film can be manufactured.

Next, part of each of the insulating films 215, 217, 221e, 243, and 245 is selectively etched to form openings and expose part of the gate electrode 209 and part of one of the pair of electrodes. Then, after a conductive film is formed in the openings, part of the conductive film is selectively etched, whereby a wiring 249 is formed. The wiring 249 can be formed using a material used for the contact plugs 219a to 219d as appropriate (see FIG. 11B).

Through the above steps, the other of the source and the drain of the transistor 161 including an oxide semiconductor film can be connected to the gates of the n-channel transistor 163a and the p-channel transistor 163b.

In the memory element included in the configuration memory, a transistor whose channel region is in an oxide semiconductor film can be stacked over an arithmetic circuit formed using a transistor including a semiconductor substrate or a semiconductor film formed over an insulating substrate. As a result, the size of a programmable logic device can be reduced.

This embodiment can be implemented by being combined as appropriate with any of the above-described embodiments.

Embodiment 3

In this embodiment, a method for forming the oxide semiconductor film 229 described in Embodiment 2 using a CAAC-OS will be described.

The first method for forming the oxide semiconductor film 229 using a CAAC-OS will be described below.

In the case where a sputtering method is employed in the method for forming an oxide semiconductor film to be the oxide semiconductor film 227 described in FIG. 9B in Embodiment 2 in forming the oxide semiconductor film 229 using a CAAC-OS, the substrate temperature is set to be higher than or equal to 150° C. and lower than or equal to 450° C., preferably higher than or equal to 200° C. and lower than or equal to 350° C., so that entry of water (including hydrogen) to the oxide semiconductor film can be prevented and a CAAC-OS including crystals can be formed.

The oxide semiconductor film is heated after formation using a CAAC-OS by the above-described method releases further hydrogen from the oxide semiconductor film 227, can diffuse part of oxygen contained in the insulating film 225 into the oxide semiconductor film 227 and the vicinity of the interface between the insulating film 225 and the oxide semiconductor film 227, and can further form the oxide semiconductor film 228 including a CAAC-OS with a high crystallinity. After that, part of the oxide semiconductor film 228 is selectively etched, so that the oxide semiconductor film 229 can be formed.

Next, the second method for forming the oxide semiconductor film 229 using a CAAC-OS will be described.

A first oxide semiconductor film is formed over the insulating film 225. The thickness of the first oxide semiconductor film is more than or equal to a thickness of one atomic layer and less than or equal to 10 nm, preferably more than or equal to 2 nm and less than or equal to 5 nm.

The first oxide semiconductor film is deposited in an oxygen gas atmosphere while the substrate temperature is higher than or equal to 100° C. and lower than or equal to 600° C., preferably higher than or equal to 150° C. and lower than or equal to 550° C., more preferably higher than or equal to 200° C. and lower than or equal to 500° C. As the substrate heating temperature in deposition is higher, the impurity concentration of the obtained oxide semiconductor film is lower. Further, entry of an impurity such as hydrogen or moisture to be contained in the first oxide semiconductor film can be reduced. Further, the atomic arrangement in the oxide semiconductor film is ordered, the density thereof is increased, so that a polycrystal or a CAAC-OS is readily formed. Furthermore, since an oxygen gas atmosphere is employed for the deposition, an unnecessary atom is not contained in the oxide semiconductor film unlike in the case of employing a rare gas atmosphere or the like, so that a polycrystal or a CAAC-OS is readily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. Note that as the oxide semiconductor film is thinner, a short-channel effect of a transistor is reduced. However, when the oxide semiconductor film is too thin, the semiconductor layer is significantly influenced by interface scattering; thus, the field effect mobility might be decreased.

After the first oxide semiconductor film is formed, first heat treatment may be performed. By the first heat treatment, water (including hydrogen) can be further released from the first oxide semiconductor film; accordingly, crystallinity can be further increased. By the first heat treatment, a CAAC-OS with high orientation can be formed. The first heat treatment is performed at a temperature higher than or equal to 200° C. and lower than the strain point of the substrate, preferably higher than or equal to 250° C. and lower than or equal to 450° C.

For the first heat treatment, a rapid thermal anneal (RTA) apparatus can be used. With the use of the RTA apparatus, only in a short time, the heat treatment can be performed at a temperature higher than or equal to the strain point of the substrate. Thus, the time required for formation of the oxide semiconductor film in which the ratio of a crystalline region to an amorphous region is high can be shortened.

The first heat treatment can be performed in an inert gas atmosphere; typically it is preferably performed in a rare gas (such as helium, neon, argon, xenon, or krypton) atmosphere or a nitrogen atmosphere. The first heat treatment may be performed in an oxygen atmosphere or a reduced-pressure atmosphere. The treatment time is from 3 minutes to 24 hours. As the treatment time is increased, the proportion of a crystalline region with respect to that of an amorphous region in the oxide semiconductor film can be increased. Note that heat treatment for longer than 24 hours is not preferable because the productivity is reduced.

Next, a second oxide semiconductor film is formed over the first oxide semiconductor film. The second oxide semiconductor film can be formed in a manner similar to that of the first oxide semiconductor film.

When the second oxide semiconductor film is formed with the substrate being heated, the second oxide semiconductor film can be crystallized using the first oxide semiconductor film as a seed crystal. At this time, the formation of the first oxide semiconductor film and the second oxide semiconductor film both including the same element is referred to as "homoepitaxial growth". The formation of the first oxide semiconductor film and the second oxide semiconductor film including at least one different element from each other is referred to as "heteroepitaxial growth".

After the second oxide semiconductor film is formed, second heat treatment may be performed. The second heat treatment may be performed using a method similar to that of the first heat treatment. By the second heat treatment, an oxide semiconductor film in which the proportion of a crystalline region is higher than that of an amorphous region can be formed. By the second heat treatment, the second oxide semiconductor film can be crystallized using the first oxide semiconductor film as a seed crystal.

Heat treatment after the oxide semiconductor film 227 formed using a CAAC-OS by the above-described method while entry of hydrogen or the like in an oxide semiconductor releases further hydrogen from the oxide semiconductor film 227, can diffuse part of oxygen contained in the insulating film 225 into the oxide semiconductor film 227 and the vicinity of the interface between the insulating film 225 and the oxide semiconductor film 227, and can further form the oxide semiconductor film 228 including a CAAC-OS with a high crystallinity. After that, part of the oxide semiconductor film 228 is selectively etched, so that the oxide semiconductor film 229 can be formed.

Hydrogen contained in the oxide semiconductor reacts with oxygen bonded to a metal atom to produce water, and in addition, a defect is formed in a lattice from which oxygen is released (or a portion from which oxygen is removed). Thus, impurities are reduced as much as possible in the formation step of the oxide semiconductor film, whereby defects in the oxide semiconductor film can be reduced. Therefore, a channel region is formed in an oxide semiconductor film including CAAC-OS which is purified by removing impurities as much as possible, so that the transistor can have stable electrical characteristics with small change in threshold voltage before and after light irradiation or the bias temperature (BT) stress test.

In order to reduce grain boundaries in the CAAC-OS, planarity of the insulating film 225 each which serves as a base insulating film of the oxide semiconductor film is preferably improved. Typically, the average surface roughness (Ra) of the insulating film 225 is preferably 1 nm or less, more preferably 0.3 nm or less, still preferably 0.1 nm or less.

Crystals included in the oxide semiconductor film grow in the direction substantially perpendicular to the surface of the insulating film 225; thus, by increasing the level of planarity of the insulating film 225, the growth directions of crystals can be substantially uniform. When such crystals are arranged in a layered manner, crystal boundaries can be reduced.

This embodiment can be implemented by being combined as appropriate with any of the above-described embodiments.

Embodiment 4

With the use of a programmable logic device according to an embodiment of the present invention, a low-power electronic device can be provided. In particular, in the case of a portable electronic device which has difficulty in receiving power at all times, an advantage of an increase in continuous operating time can be obtained when a low-power semiconductor device according to an embodiment of the present invention is added as a component of the device.

The semiconductor device including a programmable logic device according to an embodiment of the present invention can be used for display devices, personal computers, or image reproducing devices provided with recording media (typically, devices which reproduce the content of recording media such as digital versatile discs (DVDs) and have displays for displaying the reproduced images). Further, as an electronic device which can include the semiconductor device including a programmable logic device according to an embodiment of the present invention, cellular phones, portable game machines, personal digital assistants, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case is described in which the semiconductor device including a programmable logic device according to an embodiment of the present invention is applied to a portable electronic device such as a cellular phone, a smartphone, or an e-book reader.

Figure 12:
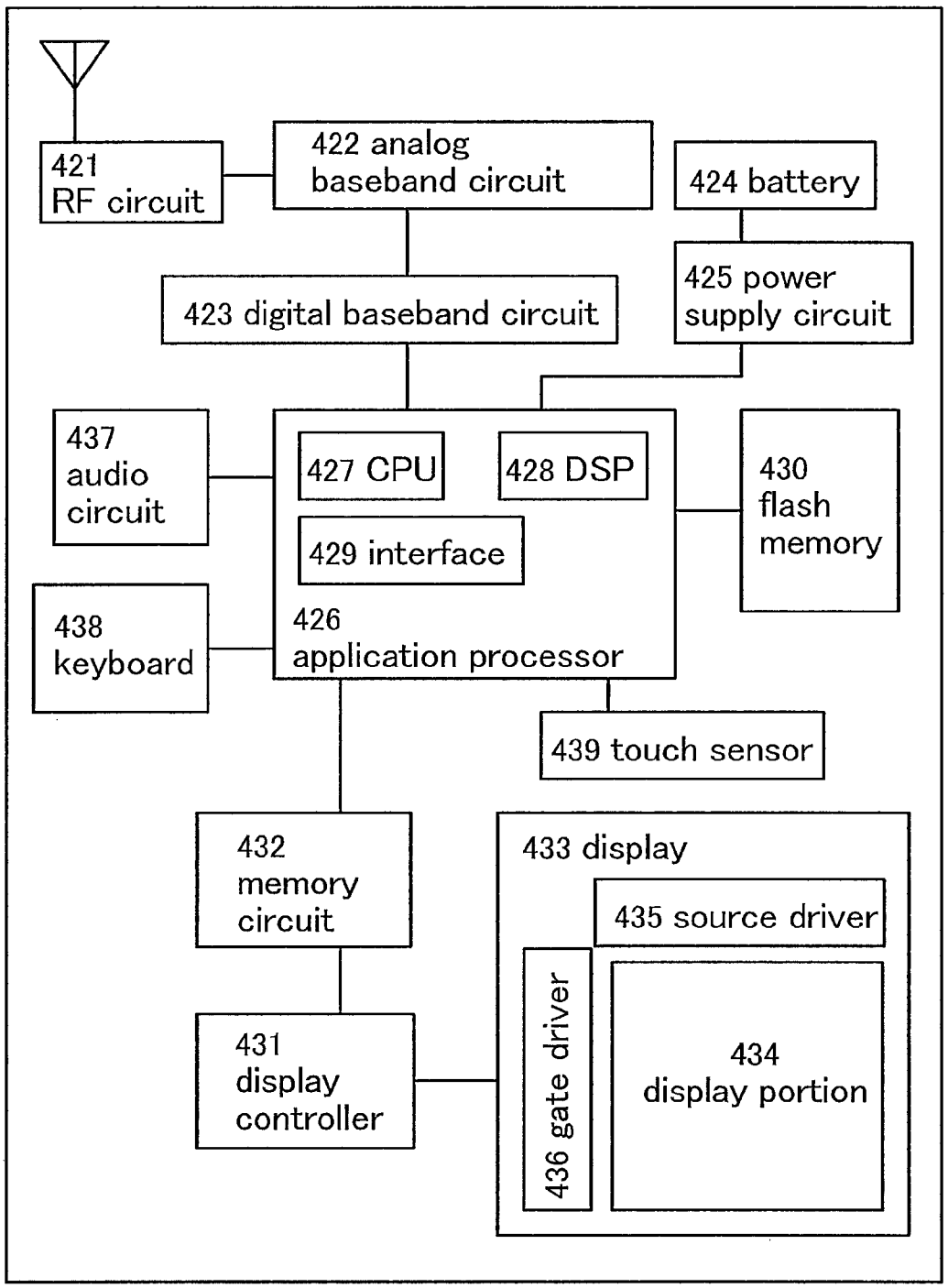
FIG. 12 is a block diagram illustrating a portable electronic device.

FIG. 12 is a block diagram of a portable electronic device. The portable electronic device illustrated in FIG. 12 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when the programmable logic device in the above embodiment is used as any of or all of the CPU 427, the digital baseband circuit 423, the memory circuit 432, the DSP 428, the interface 429, the display controller 431, and the audio circuit 437, power consumption can be reduced.

Figure 13:
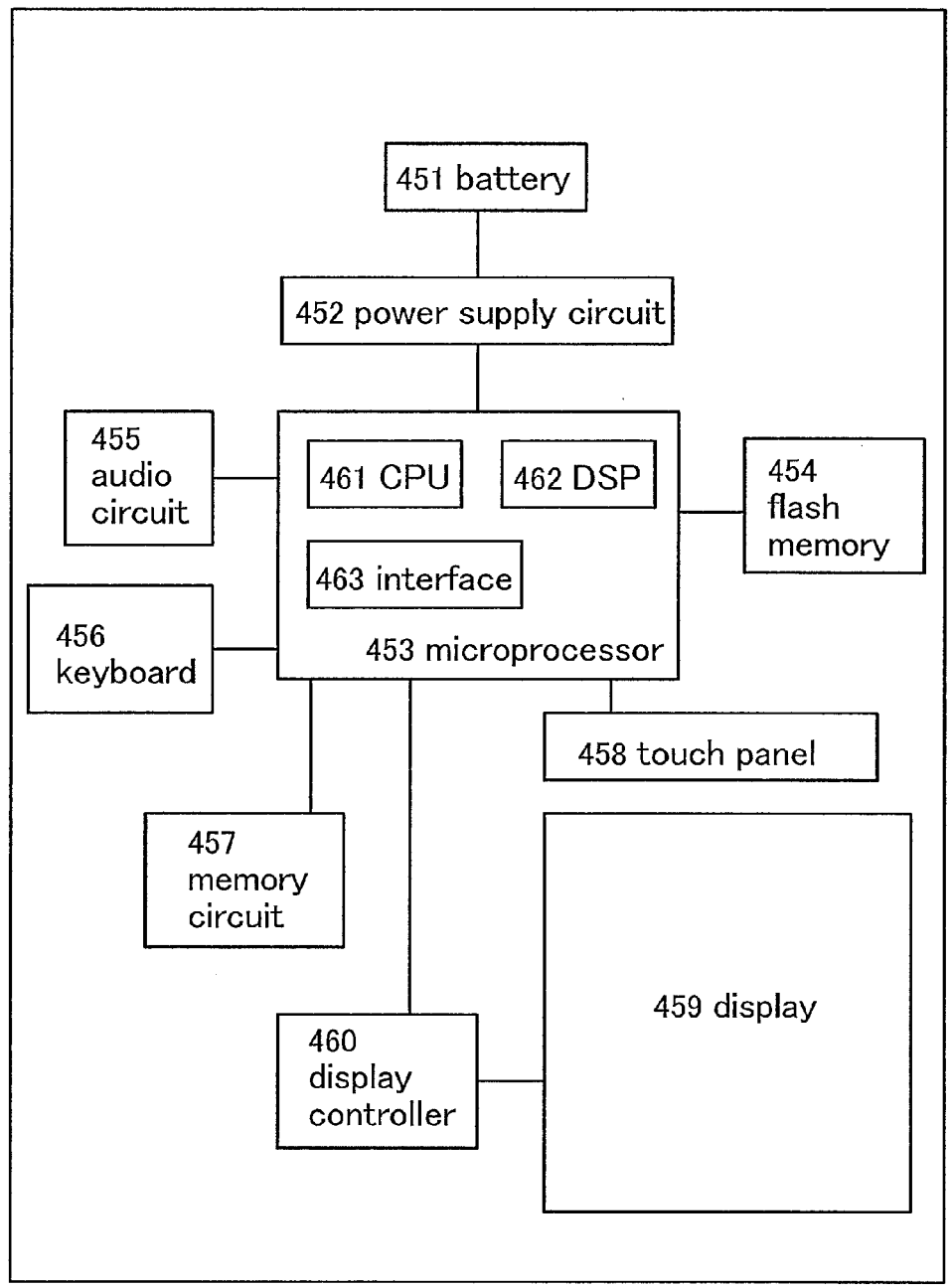
FIG. 13 is a block diagram illustrating an e-book reader.

FIG. 13 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when the programmable logic device in the above embodiment is used as any of or all of the CPU 461, the audio circuit 455, the memory circuit 457, the display controller 460, the DSP 462, and the interface 463, power consumption can be reduced.

This embodiment can be implemented by being combined as appropriate with any of the above-described embodiments.

Embodiment 5

In this embodiment, the field-effect mobility of a transistor whose channel region is formed using an oxide semiconductor film is described.

The actually measured field-effect mobility of a transistor can be lower than its original field-effect mobility because of a variety of reasons; this phenomenon occurs not only in the case of using an oxide semiconductor. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original field-effect mobility and the measured mobility of a semiconductor are $\mu_0$ and $\mu$, respectively, and a potential barrier (such as a grain boundary) exists in the semiconductor, the field-effect mobility $\mu$ can be expressed as the following formula.

$$\mu = \mu_0 \exp\left(-\frac{E}{kT}\right) \quad \text{[Formula 2]}$$

E represents the height of the potential barrier, k represents the Boltzmann constant, and T represents the absolute temperature. When the potential barrier is assumed to be attributed to a defect, the height E of the potential barrier is expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor film is less than or equal to 30 nm, the thickness of the channel may be regarded as being the same as the thickness of the semiconductor film. The drain current $I_d$ in a linear region can be expressed as the following formula.

$$I_d = \frac{W\mu V_g V_d C_{ox}}{L} \exp\left(-\frac{E}{kT}\right) \quad \text{[Formula 4]}$$

L represents the channel length and W represents the channel width, and L and W are each 10 μm in this case. In addition, $V_d$ represents the drain voltage. When dividing both sides of Formula 4 by $V_g$ and then taking logarithms of both sides, the drain current $I_d$ is expressed by the following formula.

$$\ln\left(\frac{I_d}{V_g}\right) = \quad \text{[Formula 5]}$$
$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, according to Formulas 2 and 3, $\mu_0$ can be calculated to be 120 cm$^2$/Vs. The measured mobility of an In—Sn—Zn oxide including a defect is approximately 40 cm$^2$/Vs. However, assuming that no defect exists inside the semiconductor and at the interface between the semiconductor and an insulating film, the field-effect mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the field-effect mobility $\mu_1$ at a position that is distance x away from the interface between the channel and the gate insulating film can be expressed by the following formula.

$$\frac{1}{\mu_1} = \frac{1}{\mu_0} + \frac{D}{B}\exp\left(-\frac{x}{G}\right) \quad \text{[Formula 6]}$$

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the field-effect mobility $\mu_1$ is decreased.

Figure 17:
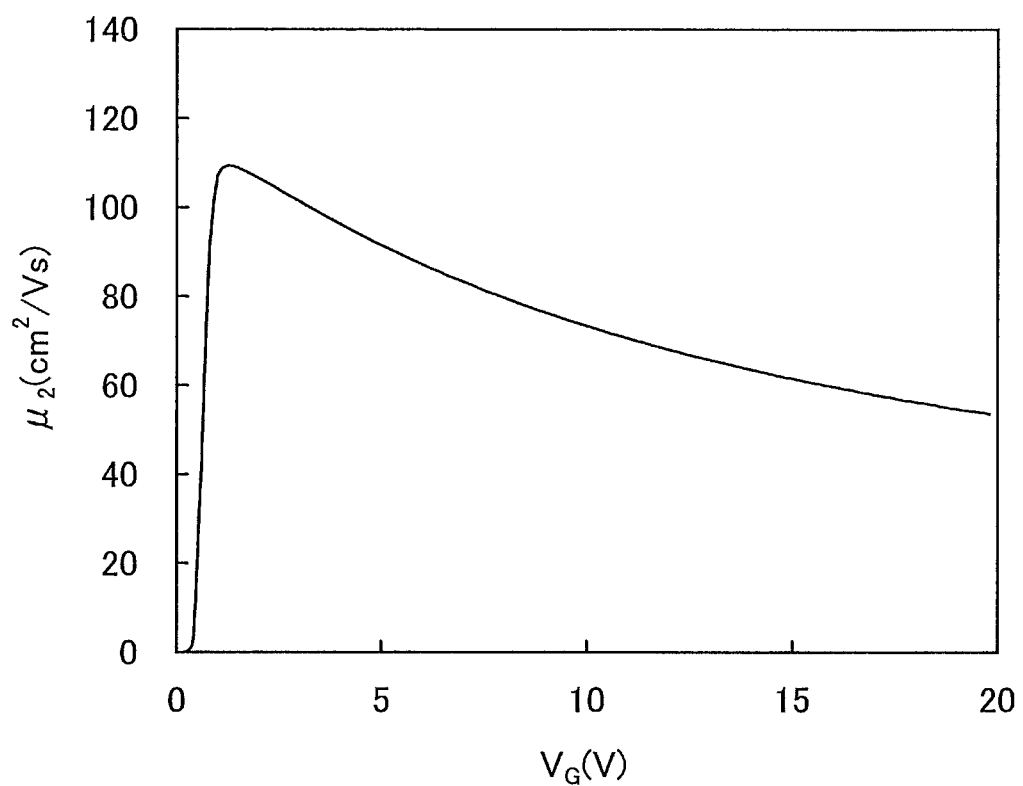
FIG. 17 is a graph showing the gate voltage dependence of field-effect mobility obtained by calculation.

Calculation results of the field-effect mobility $\mu_2$ of a transistor whose channel includes an ideal oxide semiconductor without a defect inside the semiconductor are shown in FIG. 17. For the calculation, device simulation software Sentaurus Device manufactured by Synopsys, Inc. was used. For the calculation, the band gap, the electron affinity, the dielectric constant, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the dielectric constant thereof was assumed to be 4.1. The channel length and the channel width were each assumed to be 10 μm, and the drain voltage $V_d$ was assumed to be 0.1 V.

As shown in FIG. 17, the field-effect mobility has a peak of greater than or equal to 100 cm$^2$/Vs at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Calculation results of characteristics of minute transistors which were manufactured using an oxide semiconductor having such a field-effect mobility are shown in FIGS. 18A to 18C, FIGS. 19A to 19C, and FIGS. 20A to 20C. FIGS. 21A and 21B each show a cross-sectional structure of a transistor used for the calculation. Each of the transistors illustrated in FIGS. 21A and 21B has an oxide semiconductor film including an n-type impurity semiconductor region 1103a and an impurity semiconductor region 1103c. The resistivities of the semiconductor region 1103a and the semiconductor region 1103c are $2\times10^{-3}$ Ωcm.

The transistor illustrated in FIG. 21A is formed over a base insulating film 1101 and an embedded insulator 1102 which is embedded in the base insulating film 1101 and formed of aluminum oxide. The transistor includes the semiconductor region 1103a, the semiconductor region 1103c, an intrinsic semiconductor region 1103b serving as a channel formation region therebetween, and a gate electrode 1105. The width of the gate electrode 1105 (i.e., channel length) is 33 nm.

A gate insulating film 1104 is provided between the gate electrode 1105 and the semiconductor region 1103b. In addition, a sidewall insulating film 1106a and a sidewall insulating film 1106b are provided on both sides of the gate electrode 1105, and an insulator 1107 is provided over the gate electrode 1105 so as to prevent a short circuit between the gate electrode 1105 and another wiring. The sidewall insulating film has a width of 5 nm. Further, a source electrode 1108a and a drain electrode 1108b are provided in contact with the semiconductor region 1103a and the semiconductor region 1103c, respectively. The channel width of the transistor is 40 nm.

The transistor illustrated in FIG. 21B is the same as the transistor in FIG. 21A in that it is formed over the base insulating film 1101 and the embedded insulator 1102 formed of aluminum oxide and that it includes the semiconductor region 1103a, the semiconductor region 1103c, the intrinsic semiconductor region 1103b provided therebetween, the gate electrode 1105 having a width of 33 nm, the gate insulating film 1104, the sidewall insulating film 1106a, the sidewall insulating film 1106b, the insulator 1107, the source electrode 1108a, and the drain electrode 1108b.

The transistor illustrated in FIG. 21A is different from the transistor illustrated in FIG. 21B in the conductivity type of semiconductor regions under the sidewall insulating film 1106a and the sidewall insulating film 1106b. In the transistor illustrated in FIG. 21A, the semiconductor regions under the sidewall insulating film 1106a and the sidewall insulating film 1106b are part of the n-type impurity semiconductor region 1103a and part of the semiconductor region 1103c, whereas in the transistor illustrated in FIG. 21B, the semiconductor regions under the sidewall insulating film 1106a and the sidewall insulating film 1106b are part of the intrinsic semiconductor region 1103b. In other words, a region having a width of $L_{off}$ where the semiconductor region 1103a (the semiconductor region 1103c) does not overlap with the gate electrode 1105 is provided. This region is called an offset region, and the width $L_{off}$ is called an offset length. As is clear from the drawing, the offset length is equal to the width of the sidewall insulating film 1106a (the sidewall insulating film 1106b).

Figure 18A:
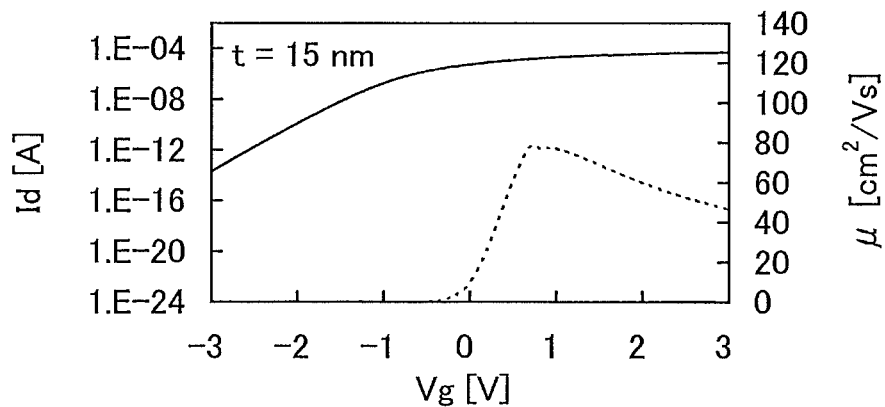
FIGS. 18A to 18C graphs each showing the gate voltage dependence of a drain current and field-effect mobility obtained by calculation.
Figure 18B:
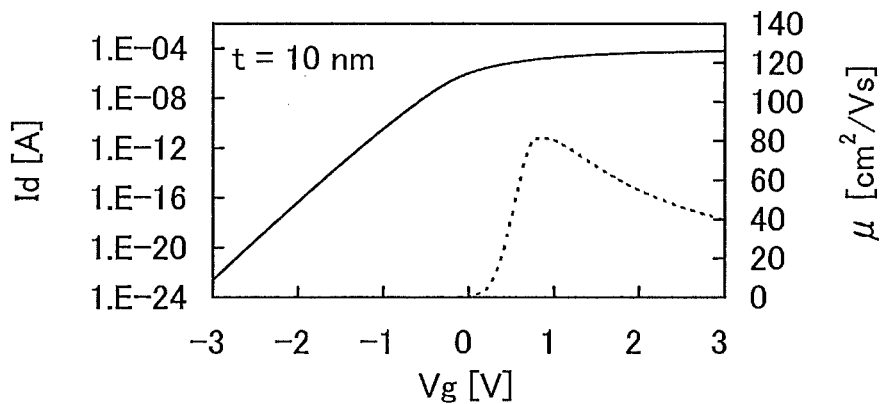
Figure 18C:
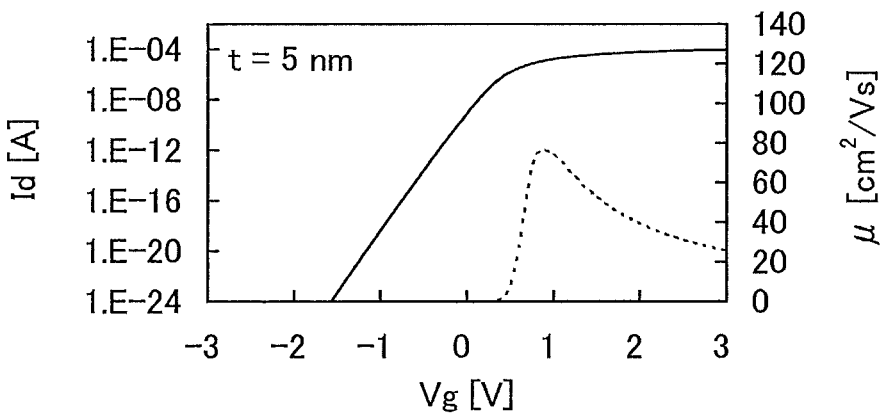

The other parameters used in calculation are as described above. For the calculation, device simulation software Sentaurus Device manufactured by Synopsys, Inc. was used. FIGS. 18A to 18C show the gate voltage ($V_g$: a potential difference between the gate and the source) dependence of the drain current ($I_d$, indicated by a solid line) and the field-effect mobility (μ, indicted by a dotted line) of the transistor having the structure illustrated in FIG. 21A. The drain current $I_d$ was calculated where the drain voltage (a potential difference between the drain and the source) was +1 V and the field-effect mobility μ was calculated where the drain voltage was +0.1 V.

The thickness of the gate insulating film was 15 nm, 10 nm, and 5 nm in FIG. 18A, FIG. 18B, and FIG. 18C, respectively. As the gate insulating layer gets thinner, the drain current $I_d$ (off-state current) particularly in an off state is significantly decreased. In contrast, there is no noticeable change in the peak value of the field-effect mobility μ and the drain current $I_d$ (on-state current) in an on state. The graphs show that the drain current exceeds 10 μA at a gate voltage of around 1 V. That is, the value of an on-state current required for an LSI can be satisfied.

Figure 19A:
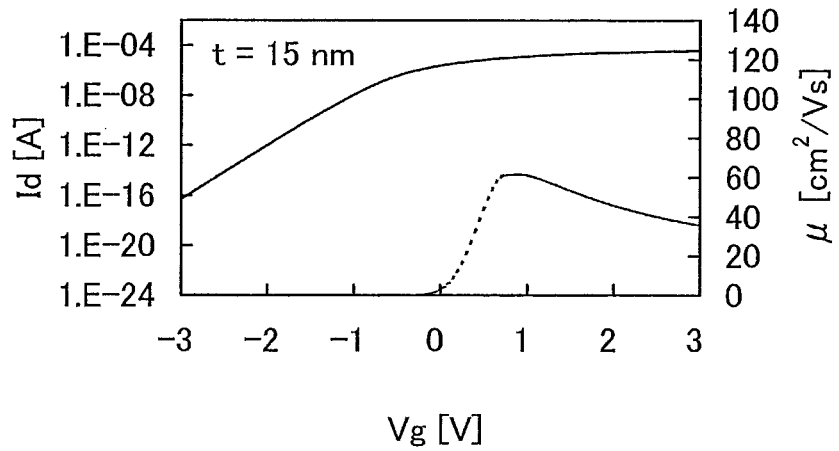
FIGS. 19A to 19C graphs each showing the gate voltage dependence of a drain current and field-effect mobility obtained by calculation.
Figure 19B:
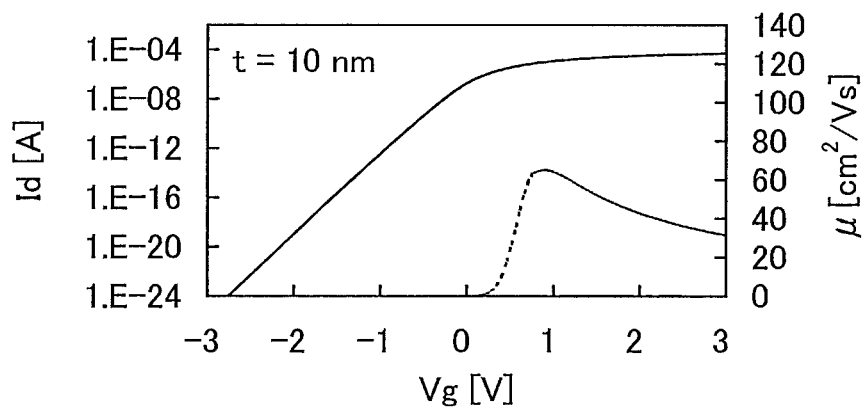
Figure 19C:
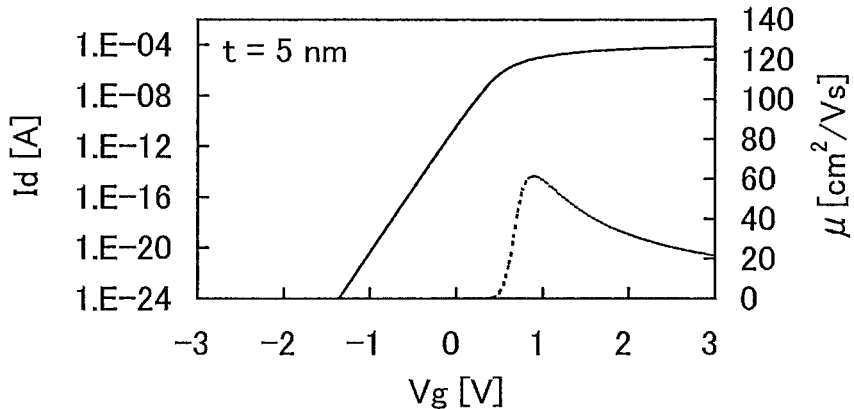

FIGS. 19A to 19C show the gate voltage $V_g$ dependence of the drain current $I_d$ (indicated by a solid line) and the field-effect mobility μ (indicated by a dotted line) of the transistor having the structure illustrated in FIG. 21B where the offset length $L_{off}$ was 5 nm. The drain current $I_d$ was calculated where the drain voltage was +1 V and the field-effect mobility μ was calculated where the drain voltage was +0.1 V. The thickness of the gate insulating film was 15 nm, 10 nm, and 5 nm in FIG. 19A, FIG. 19B, and FIG. 19C, respectively.

Figure 20A:
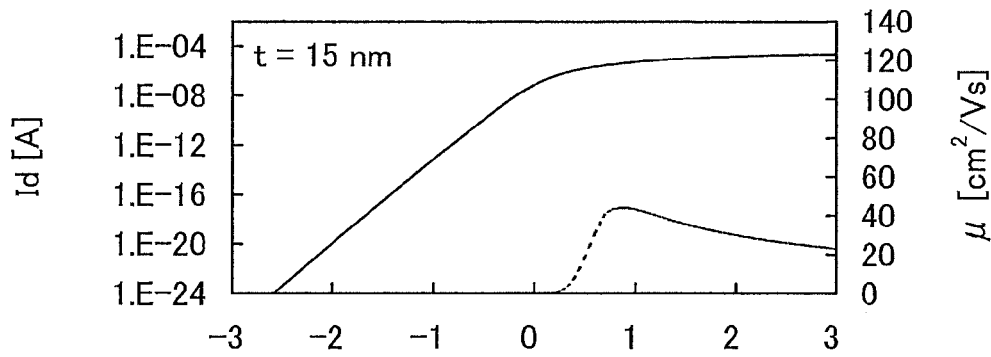
FIGS. 20A to 20C graphs each showing the gate voltage dependence of a drain current and field-effect mobility obtained by calculation.
Figure 20B:
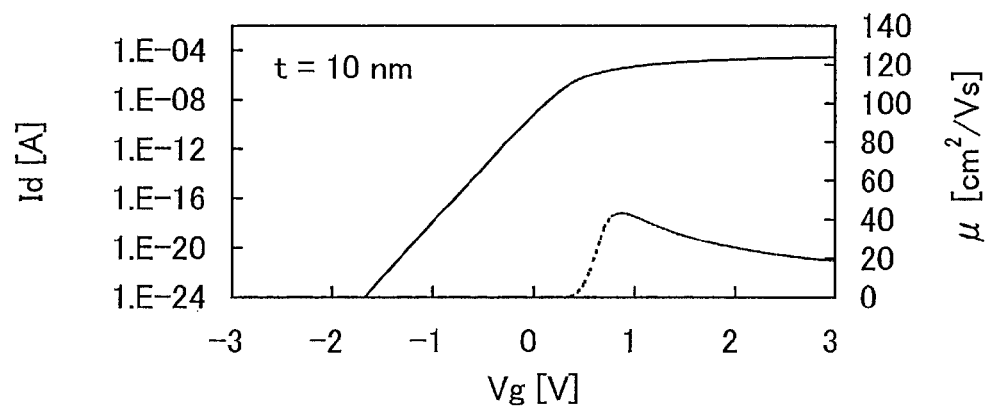
Figure 20C:
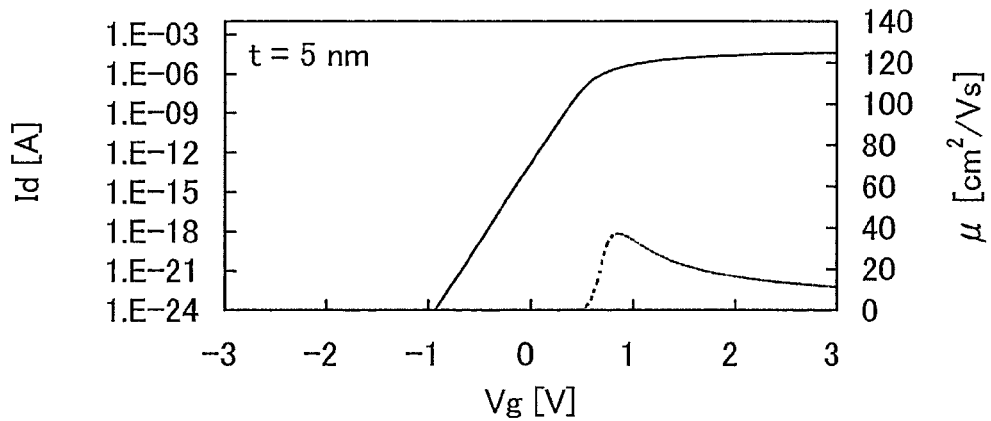
Figure 21A:
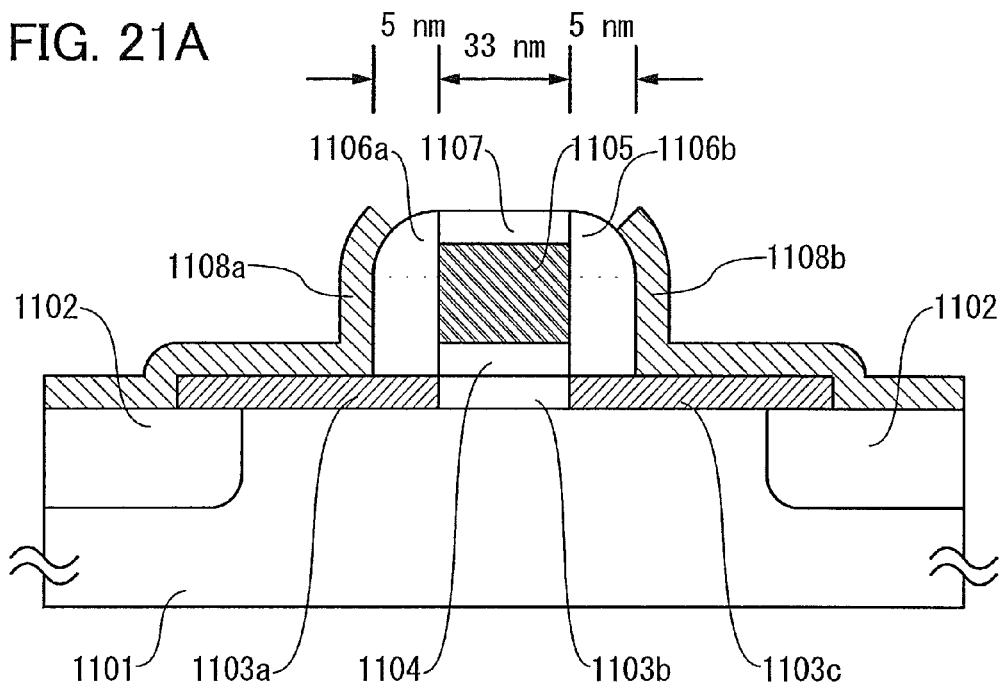
FIGS. 21A and 21B are cross-sectional views each illustrating a structure of a transistor used for calculation.
Figure 21B:
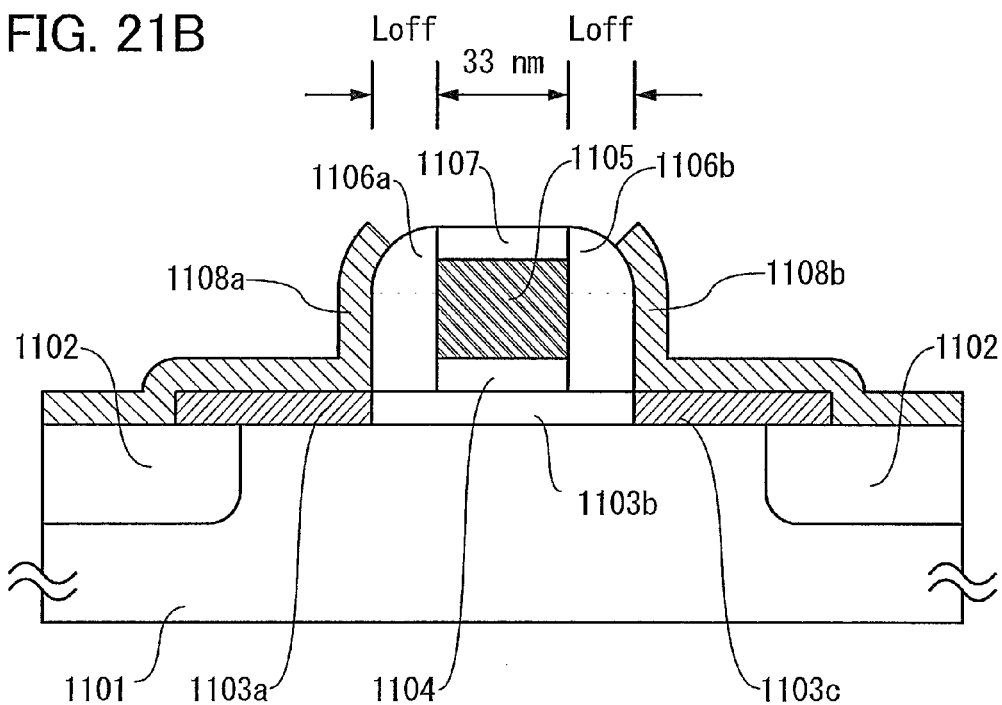

FIGS. 20A to 20C show the gate voltage $V_g$ dependence of the drain current $I_d$ (indicated by a solid line) and the field-effect mobility μ (indicated by a dotted line) of the transistor having the structure illustrated in FIG. 21B where the offset length $L_{off}$ was 15 nm. The drain current $I_d$ was calculated where the drain voltage was +1 V and the field-effect mobility μ was calculated where the drain voltage was +0.1 V. The thickness of the gate insulating film was 15 nm, 10 nm, and 5 nm in FIG. 20A, FIG. 20B, and FIG. 20C, respectively.

In either of the structures, as the gate insulating film gets thinner, the off-state current is significantly decreased, whereas no noticeable change occurs in the peak value of the field-effect mobility μ and the on-state current.

The peak of the field-effect mobility μ is about 80 cm²/Vs in FIGS. 18A to 18C, about 60 cm²/Vs in FIGS. 19A to 19C, and 40 cm²/Vs in FIGS. 20A to 20C; thus, the peak of the field-effect mobility μ decreases as the offset length $L_{off}$ is increased. The same applies to the off-state current. The on-state current also decreases as the offset length $L_{off}$ is increased; however, the decrease in the on-state current is much more gradual than the decrease in the off-state current. Further, either graph shows that the drain current exceeds 10 μA at a gate voltage of around 1 V. That is, the value of an on-state current required for LSI can be satisfied.

This embodiment can be implemented by being combined as appropriate with any of the above-described embodiments.

Embodiment 6

In this embodiment, electrical characteristics and reliability of a transistor whose channel region is formed using an oxide semiconductor film including In, Sn, and Zn as main components as an oxide semiconductor film are described.

A transistor in which an oxide semiconductor including In, Sn, and Zn as main components is used as a channel formation region can be provided with favorable characteristics by depositing the oxide semiconductor while heating a substrate or by performing heat treatment after an oxide semiconductor film is formed. The main component refers to an element included in composition at 5 atomic % or more.

By heating the substrate at the time of or after formation of the oxide semiconductor film including In, Sn, and Zn as main components, the field-effect mobility of the transistor can be improved. Further, the threshold voltage of the transistor can be shifted in the positive direction to make the transistor a normally-off transistor.

Figure 22A:
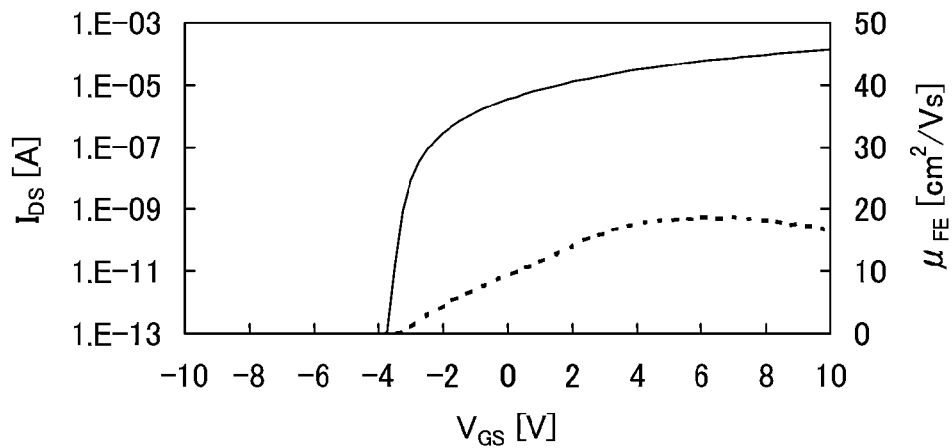
FIGS. 22A to 22C are graphs each showing characteristics of a transistor including an oxide semiconductor film.
Figure 22B:
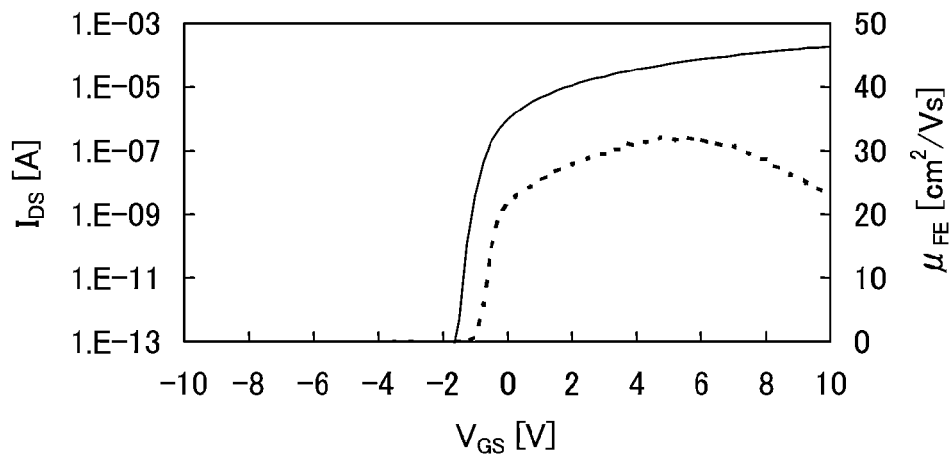
Figure 22C:
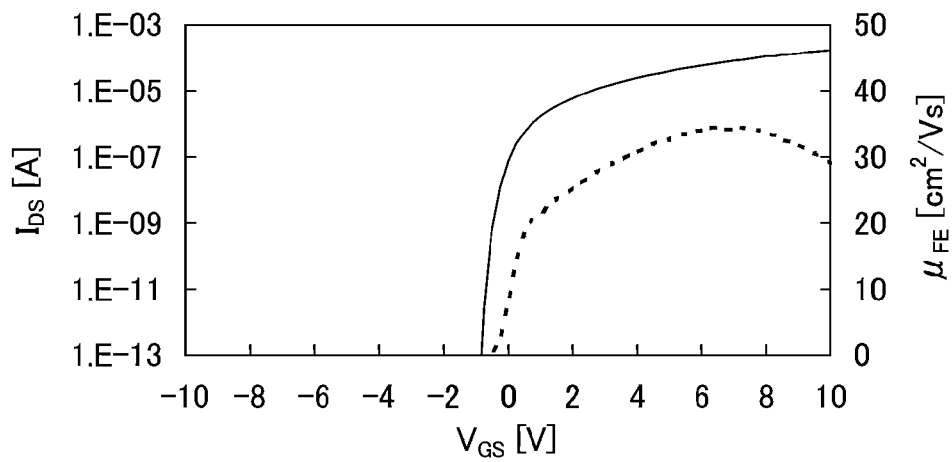

As an example, FIGS. 22A to 22C each show characteristics of a transistor that includes an oxide semiconductor film including In, Sn, and Zn as main components with a channel length L of 3 µm and a channel width W of 10 µm, and a gate insulating film with a thickness of 100 nm. The drain voltage $V_d$ was set to 10 V.

FIG. 22A shows characteristics of a transistor whose oxide semiconductor film including In, Sn, and Zn as main components was formed by a sputtering method without heating a substrate. The field-effect mobility of the transistor was up to 18.8 cm$^2$/Vsec. On the other hand, when the oxide semiconductor film including In, Sn, and Zn as main components is formed while heating the substrate, the field-effect mobility can be improved. FIG. 22B shows characteristics of a transistor whose oxide semiconductor film including In, Sn, and Zn as main components was formed while heating a substrate at 200° C.; the field-effect mobility of the transistor was up to 32.2 cm$^2$/Vsec.

The field-effect mobility can be further improved by performing heat treatment after formation of the oxide semiconductor film including In, Sn, and Zn as main components. FIG. 22C shows characteristics of a transistor whose oxide semiconductor film including In, Sn, and Zn as main components was formed by sputtering at 200° C. and then subjected to heat treatment at 650° C. The field-effect mobility of the transistor was up to 34.5 cm$^2$/Vsec.

The heating of the substrate can be expected to have an effect of reducing entrance of moisture into the oxide semiconductor film during the formation by sputtering. Further, the heat treatment after film formation enables hydrogen, a hydroxyl group, or moisture to be removed from the oxide semiconductor film, so that the field-effect mobility can be improved as described above. Such an improvement in the field-effect mobility is considered to be achieved not only by removal of impurities by dehydration or dehydrogenation but also by a reduction in the interatomic distance due to an increase in density. In addition, by removal of impurities from the oxide semiconductor, the oxide semiconductor can be crystallized with high purification. With such a highly purified non-single-crystal oxide semiconductor, ideally, a field-effect mobility over 100 cm$^2$/Vsec can be expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be provided.

The heating of the substrate during film formation and/or the heat treatment after the film formation contribute(s) not only to improvement of the field-effect mobility but also to make the transistor a normally-off transistor. In a transistor in which an oxide semiconductor film including In, Sn, and Zn as main components and is formed without heating a substrate is used as a channel formation region, the threshold voltage tends to be shifted in the negative direction. However, when the oxide semiconductor film formed while heating the substrate is used, such a negative shift of the threshold voltage can be prevented. That is, the threshold voltage is shifted so that the transistor becomes a normally-off transistor; this tendency can be confirmed by comparison between FIGS. 22A and 22B.

The threshold voltage can also be controlled by changing the ratio of In, Sn, and Zn; a normally-off transistor is expected to be formed with a composition ratio of In:Sn:Zn of 2:1:3. In addition, when the composition ratio of the target is In:Sn:Zn=2:1:3, an oxide semiconductor film having high crystallinity can be formed.

The temperature of the heating of the substrate or the temperature of the heat treatment is higher than or equal to 150° C., preferably higher than or equal to 200° C., further preferably higher than or equal to 400° C. With film formation or heat treatment at a higher temperature, the transistor can be made to a normally-off transistor.

Further, by heating of the substrate during film formation and/or by heat treatment after the film formation, the stability against a gate-bias stress can be increased. For example, when a gate bias is applied with an intensity of 2 MV/cm at 150° C. for one hour, a drift of the threshold voltage can be suppressed to less than ±1.5 V, preferably less than ±1.0 V.

A BT stress test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$–$I_{ds}$ characteristics of the transistors were measured at a substrate temperature of 25° C. at $V_{ds}$ of 10 V where $V_{ds}$ is the drain voltage (the potential difference between the drain and the source) of each transistor. Next, the substrate temperature was changed to 150° C. and $V_{ds}$ was changed to 0.1 V. Then, $V_{gs}$ of 20 V was applied so that the intensity of the electric field applied to each gate insulating film was 2 MV/cm, and the condition was kept for one hour. Next, $V_{gs}$ was changed to 0 V. Then, $V_{gs}$–$I_{ds}$ characteristics of the transistors were measured at a substrate temperature of 25° C. at $V_{ds}$ of 10 V. This process is called a positive BT stress test.

In a similar manner, first, $V_{gs}$–$I_{ds}$ characteristics of the transistors were measured at a substrate temperature of 25° C. at $V_{ds}$ of 10 V. Next, the substrate temperature was changed to 150° C. and $V_{ds}$ was changed to 0.1 V. Then, $V_{gs}$ of −20 V was applied so that the intensity of the electric field applied to each gate insulating film was −2 MV/cm, and the condition was kept for one hour. Next, $V_{gs}$ was changed to 0 V. Then, $V_{gs}$–$I_{ds}$ characteristics of the transistors were measured at a substrate temperature of 25° C. at $V_{ds}$ of 10 V. This process is called a negative BT stress test.

Figure 23A:
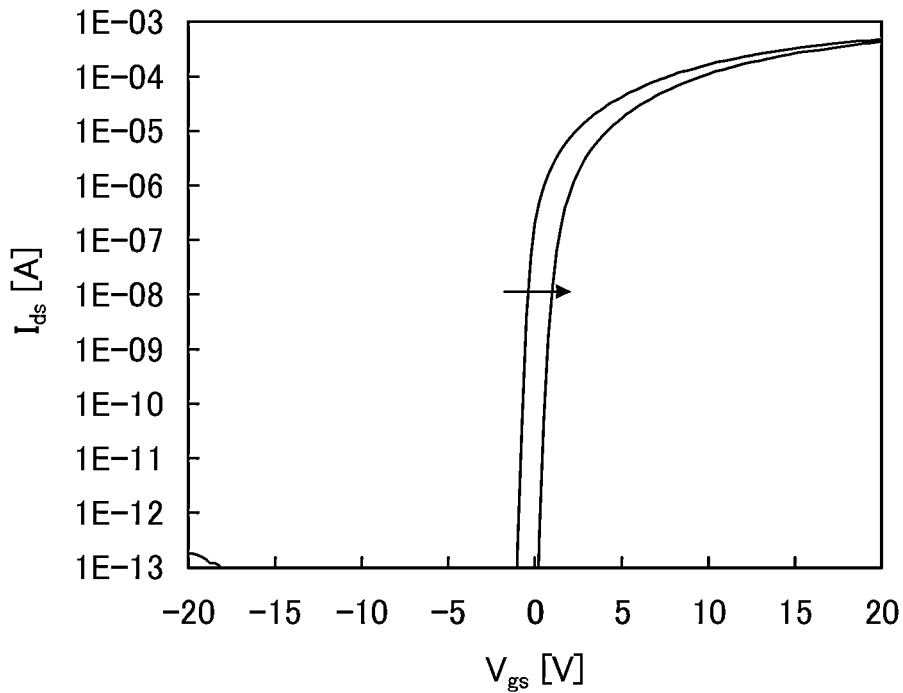
FIGS. 23A and 23B are graphs each showing $V_{gs}$–$I_{ds}$ characteristics after BT stress tests of a transistor of Sample 1.
Figure 23B:
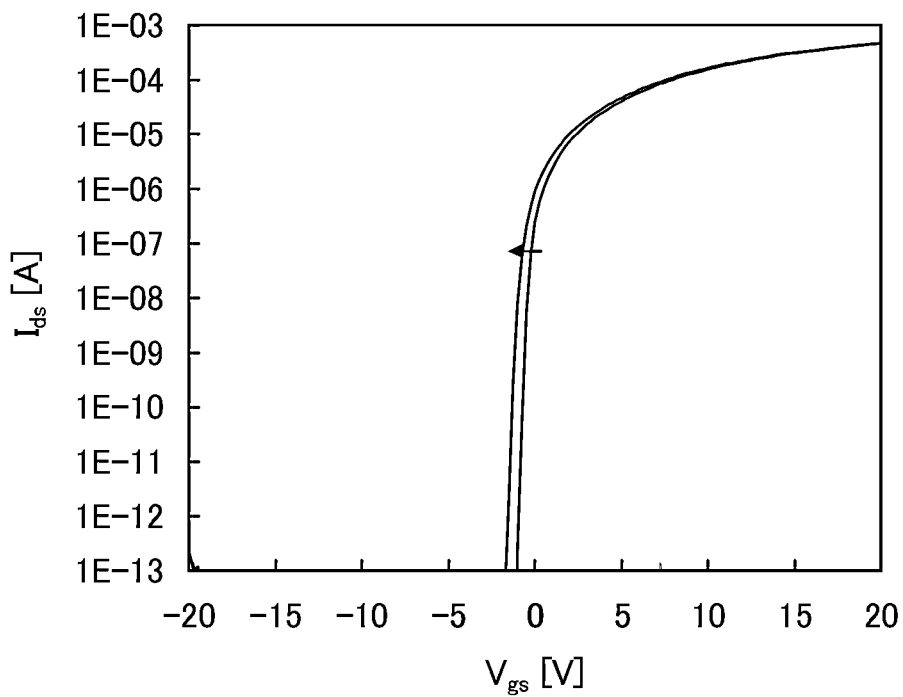
Figure 24A:
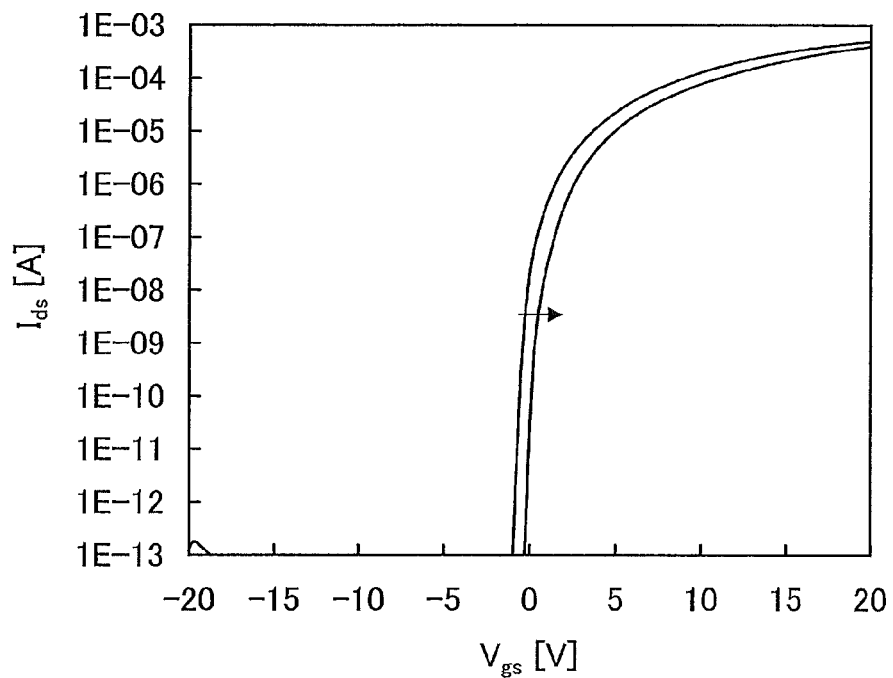
FIGS. 24A and 24B are graphs each showing $V_{gs}$–$I_{ds}$ characteristics after BT stress tests of a transistor of Sample 2.
Figure 24B:
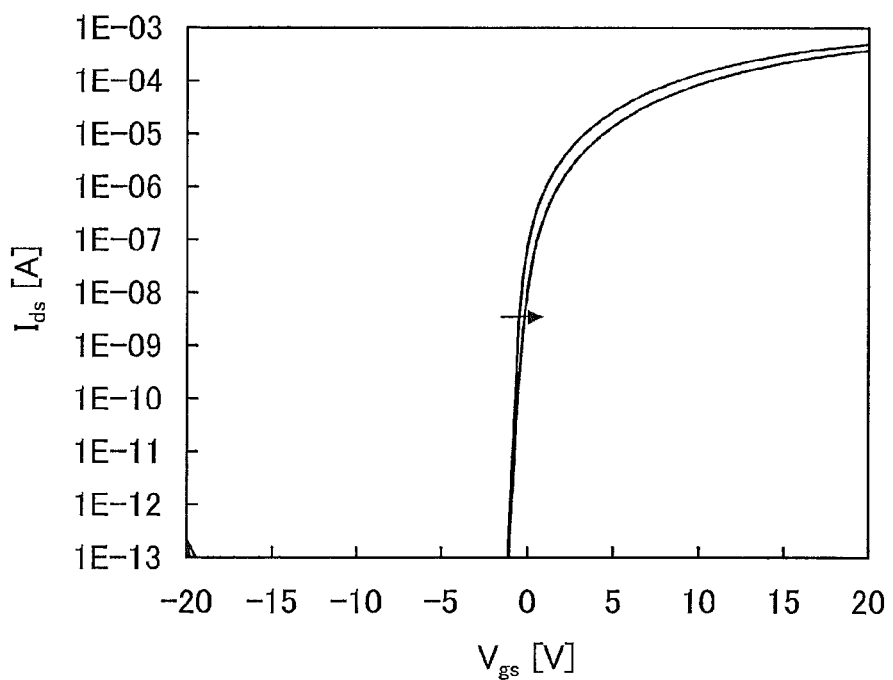

FIGS. 23A and 23B show a result of the positive BT stress test of Sample 1 and a result of the negative BT stress test of Sample 1, respectively. FIGS. 24A and 24B show a result of the positive BT stress test of Sample 2 and a result of the negative BT stress test of Sample 2, respectively.

The amount of shift in the threshold voltage of Sample 1 due to the positive BT stress test and that amount due to the negative BT stress test were 1.80 V and −0.42 V, respectively. The amount of shift in the threshold voltage of Sample 2 due to the positive BT stress test and that amount due to the negative BT stress test were 0.79 V and 0.76 V, respectively. It is found that, in each of Sample 1 and Sample 2, the amount of shift in the threshold voltage by the BT stress test is small and the reliability of each transistor is high.

The heat treatment can be performed in an oxygen atmosphere; the heat treatment may be performed first in an atmosphere of nitrogen or an inert gas or under reduced pressure, and then in an atmosphere including oxygen. Oxygen can be supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is likely to be caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices, which can be included in the oxide semiconductor without causing crystal distortion or the like as long as the concentration of excess oxygen is greater than or equal to $1\times10^{16}/cm^3$ and less than or equal to $2\times10^{20}/cm^3$.

Further, a more stable oxide semiconductor film can be obtained by performing heat treatment to form a crystal in at least part of the oxide semiconductor. For example, when an oxide semiconductor film which is formed by sputtering using a target having a composition ratio of In:Sn:Zn=1:1:1 without heating a substrate is analyzed by X-ray diffraction (XRD), a halo pattern is observed. That oxide semiconductor film can be crystallized by heat treatment. When heat treatment at 650° C. is performed thereon, for example, a clear diffraction peak can be observed by X-ray diffraction, though the temperature of the heat treatment can be set as appropriate.

An XRD analysis of an In—Sn—Zn—O film was conducted. The XRD analysis was conducted using an X-ray diffractometer D8 ADVANCE manufactured by Bruker AXS, in the out-of-plane direction.

Sample A and Sample B were prepared, on which the XRD analysis were performed. Methods for manufacturing Sample A and Sample B are described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. The substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed thereon for one hour and heat treatment in an oxygen atmosphere was further performed thereon for one hour without lowering the temperature. A sample manufactured in this manner was used as Sample B.

Figure 25:
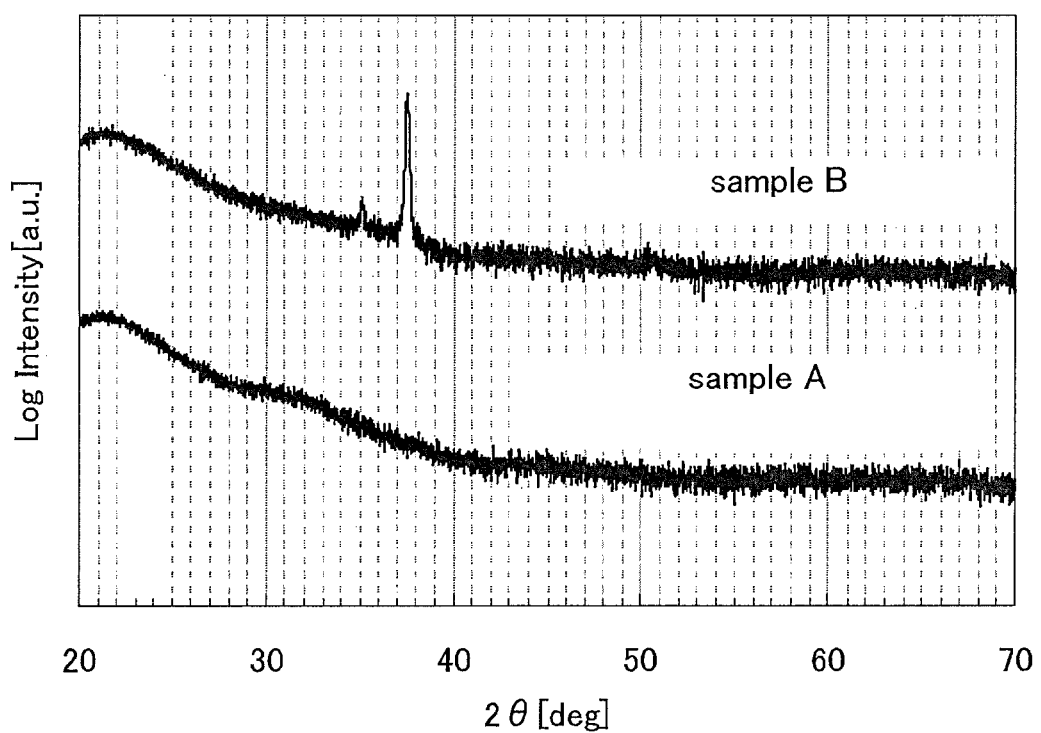
FIG. 25 is a graph showing XRD spectra of Sample A and Sample B.

FIG. 25 shows XRD spectra of Sample A and Sample B. No peak derived from a crystal was observed in Sample A, whereas peaks derived from a crystal were observed at 2θ of around 35 deg and 2θ in the range of from 37 deg to 38 deg in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are adverse impurities for an oxide semiconductor, from being included in the film or an effect of removing them from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be reduced to 1 aA/μm or less, where the unit of the off-state current means the amount per micrometer of a channel width.

Figure 26:
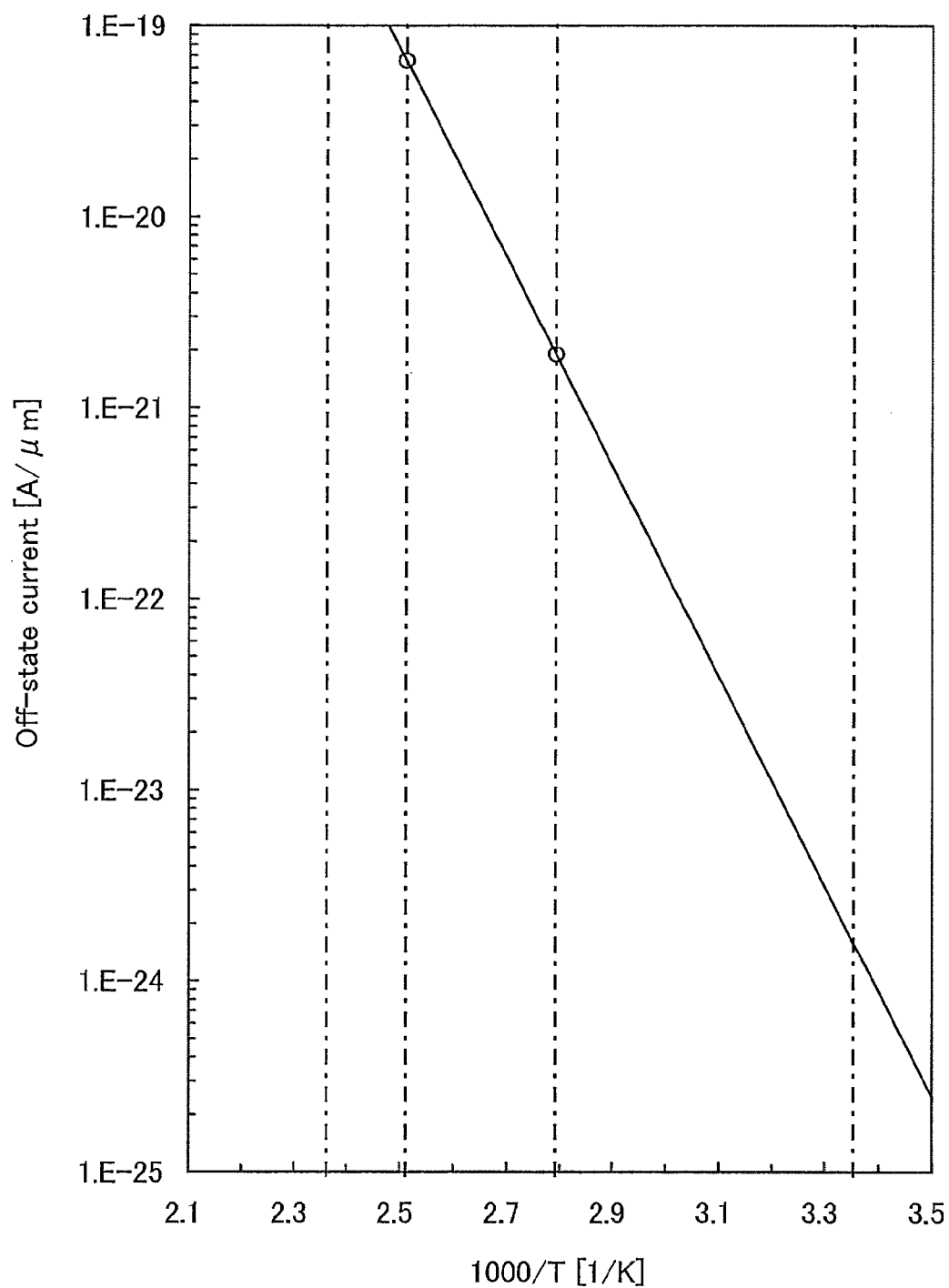
FIG. 26 is a graph showing the relation between an off-state current of a transistor and substrate temperature at measurement.

FIG. 26 shows a relation between the off-state current of a transistor and the inverse of substrate temperature (absolute temperature) T at measurement, where for simplicity, the horizontal axis indicates a value (1000/T) obtained by multiplying an inverse of the substrate temperature at measurement by 1000.

Specifically, as shown in FIG. 26, the off-state current can be reduced to 1 aA/μm ($1\times10^{-18}$ A/μm) or less, 100 zA/μm ($1\times10^{-19}$ A/μm) or less, and 1 zA/μm ($1\times10^{-21}$ A/μm) or less at substrate temperatures T of 125° C., 85° C., and room temperature (27° C.), respectively. Preferably, the off-state current can be reduced to 0.1 aA/μm ($1\times10^{-19}$ A/μm) or less, 10 zA/μm ($1\times10^{-20}$ A/μm) or less, and 0.1 zA/μm ($1\times10^{-22}$ A/μm) or less at 125° C., 85° C., and room temperature, respectively. The above values of off-state currents are clearly much lower than that of the transistor using Si as a semiconductor film.

Needless to say, in order to prevent hydrogen, water, and the like from entering the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent water from entering the film. In addition, it is preferable to use a target which is highly purified so as not to include impurities such as hydrogen and water. Although it is possible to remove water from a film of an oxide semiconductor including In, Sn, and Zn as main components by heat treatment, the temperature at which water is released from the oxide semiconductor including In, Sn, and Zn as main components is higher than the temperature at which water is released from an oxide semiconductor including In, Ga, and Zn as main components; therefore, a water-free film is preferably formed in an as-depo state.

In addition, the relation between the substrate temperature and electric characteristics of a transistor using Sample B which has been subjected to the heat treatment at 650° C. after formation of the oxide semiconductor film was evaluated.

The transistor used for the measurement has a channel length L of 3 μm, a channel width W of 10 μm, Lov of 0 μm, and dW of 0 μm. In addition, $V_{ds}$ was set to 10V. The substrate temperature was set to −40° C., −25° C., 25° C., 75° C., 125° C., and 150° C. In the transistor, the width of a portion where a gate electrode overlaps with one of a pair of electrodes is denoted by Lov, and the width of a portion of the pair of electrodes, which does not overlap with the oxide semiconductor film, is denoted by dW.

Figure 27:
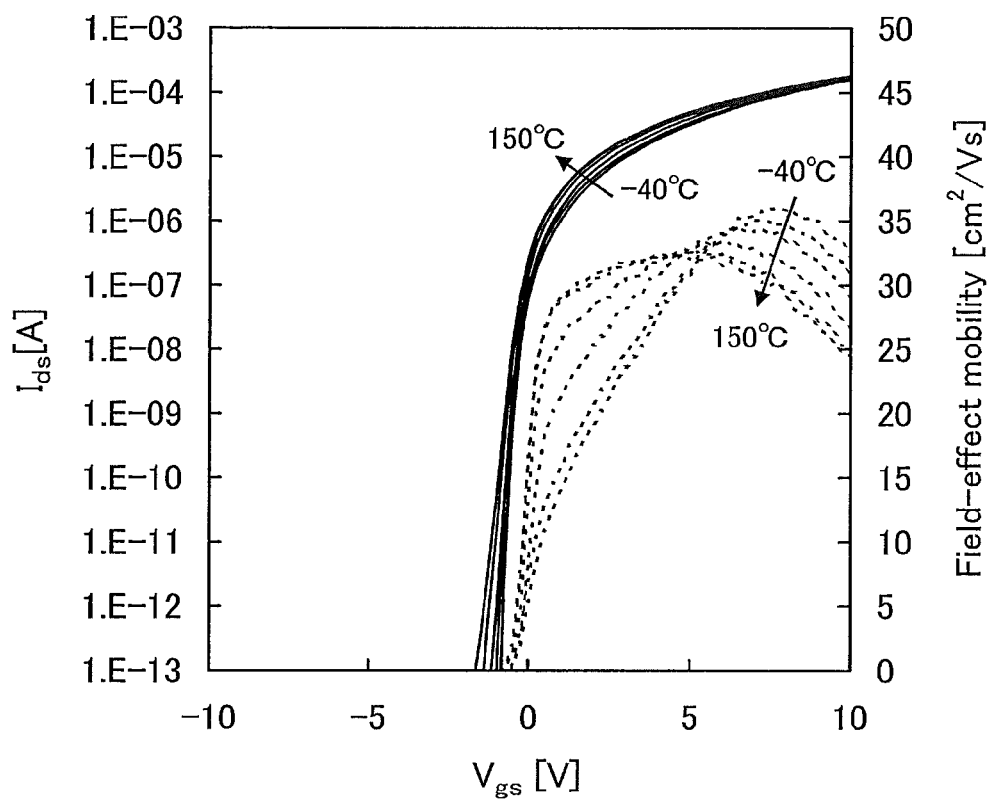
FIG. 27 is a graph showing $V_{gs}$ dependence of $I_{ds}$ and field-effect mobility.

FIG. 27 shows the $V_{gs}$ dependence of $I_{ds}$ (indicated by a solid line) and of the field-effect mobility (indicated by a dotted line). Further, FIG. 28A shows a relation between the substrate temperature and the threshold voltage, and FIG. 28B shows a relation between the substrate temperature and the field-effect mobility.

Figure 28A:
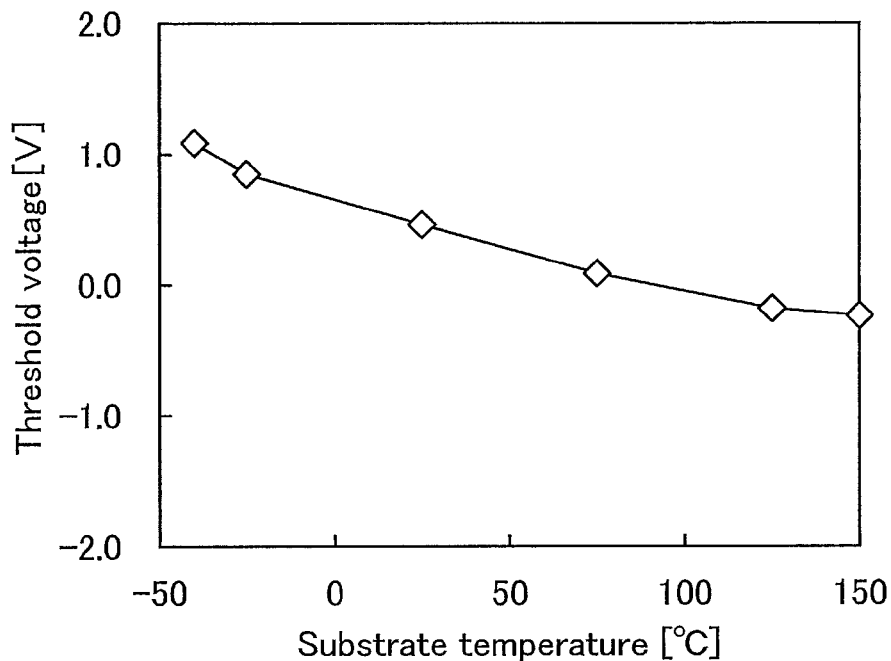
FIG. 28A is a graph showing a relation between substrate temperature and threshold voltage and FIG. 28B is a graph showing a relation between substrate temperature and field-effect mobility.

It is seen from FIG. 28A that the threshold voltage gets lower as the substrate temperature increases. The threshold voltage is decreased from 1.09 V to −0.23 V in the range from −40° C. to 150° C.

Figure 28B:
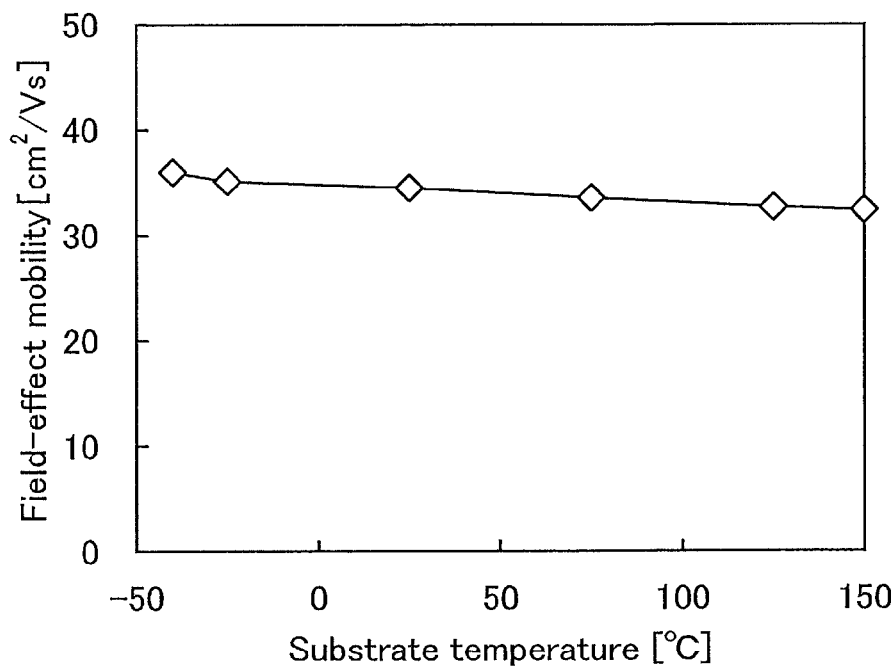

Further, it is seen from FIG. 28B that the field-effect mobility gets lower as the substrate temperature increases. The field-effect mobility is decreased from 36 cm$^2$/Vs to 32 cm$^2$/

Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be exhibited with the off-state current suppressed to 1 aA/μm or less, which can provide an on-state current as high as is needed for an LSI. For example, in an FET where L/W is 33 nm/40 nm, an on-state current of 12 μA or more can flow at a gate voltage of 2.7 V at a drain voltage of 1.0 V. In addition, sufficient electric characteristics can be ensured in a temperature range needed for operation of the transistor. With such characteristics, an integrated circuit can be equipped with a novel function without decreasing the operation speed by providing a transistor including an oxide semiconductor in the integrated circuit formed using a silicon semiconductor.

This embodiment can be implemented by being combined as appropriate with any of the above-described embodiments.

Example 1

In this example, an example of a transistor in which an In—Sn—Zn—O film is used as an oxide semiconductor film will be described with reference to FIGS. 29A and 29B and the like.

Figure 29A:
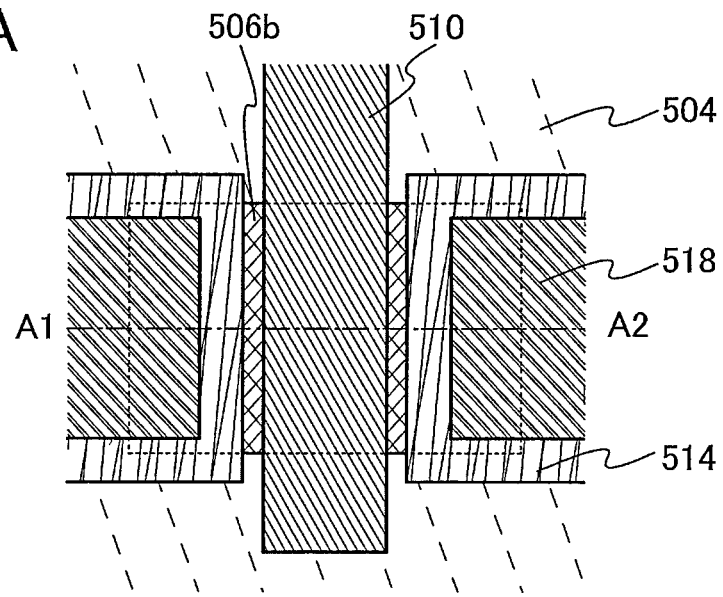
FIGS. 29A and 29B are a top view and a cross-sectional view of a transistor, respectively.
Figure 29B:
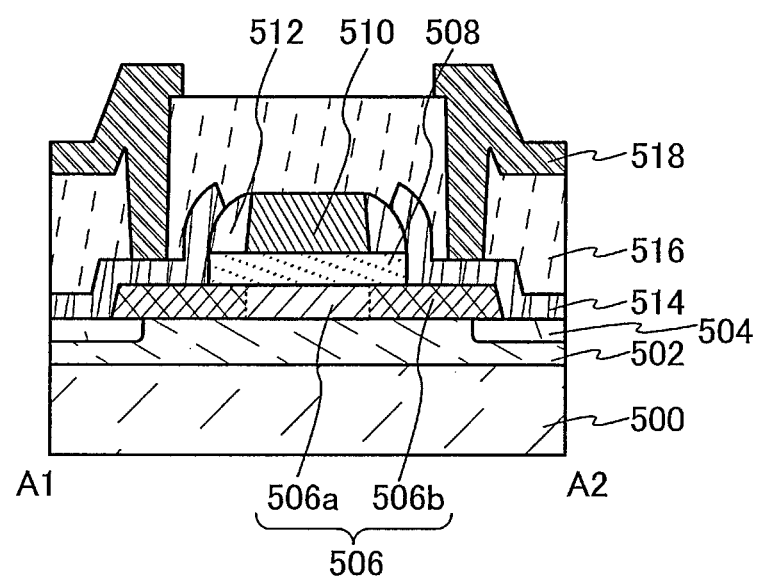

FIGS. 29A and 29B are a top view and a cross-sectional view of a coplanar transistor having a top-gate top-contact structure. FIG. 29A is the top view of the transistor. FIG. 29B illustrates a cross-sectional view along dashed-dotted line A1-A2 in FIG. 29A.

The transistor illustrated in FIG. 29B includes a substrate 500; a base insulating film 502 provided over the substrate 500; a protective insulating film 504 provided in the periphery of the base insulating film 502; an oxide semiconductor film 506 provided over the base insulating film 502 and the protective insulating film 504 and including a high-resistance region 506a and low-resistance regions 506b; a gate insulating film 508 provided over the oxide semiconductor film 506; a gate electrode 510 provided to overlap with the oxide semiconductor film 506 with the gate insulating film 508 positioned therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not illustrated, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

The transistor of this embodiment can be combined as appropriate with any of the configurations, methods, and the like described in the other embodiments.

Example 2

In this example, another example of a transistor in which an In—Sn—Zn—O film is used as an oxide semiconductor film will be described.

Figure 30A:
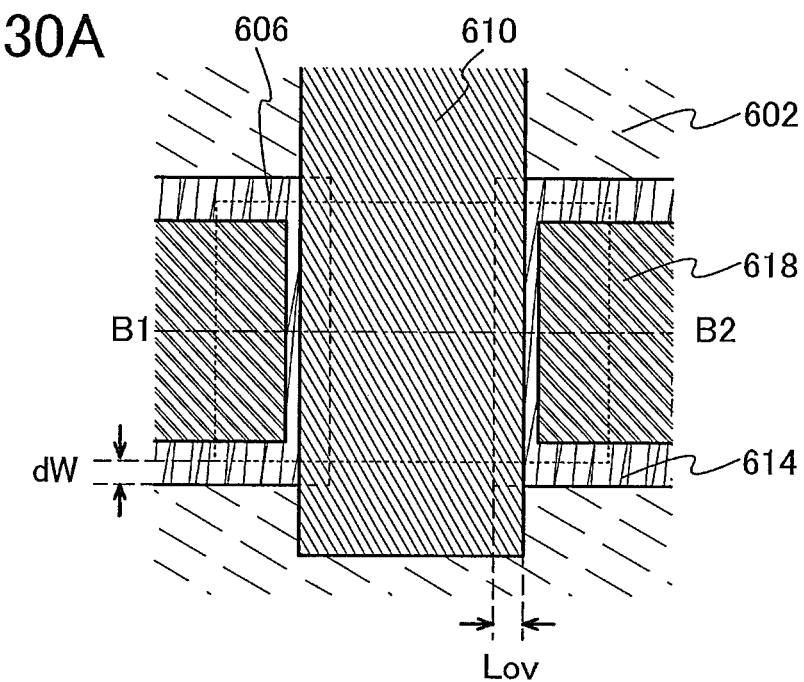
FIGS. 30A and 30B are a top view and a cross-sectional view of a transistor, respectively.
Figure 30B:
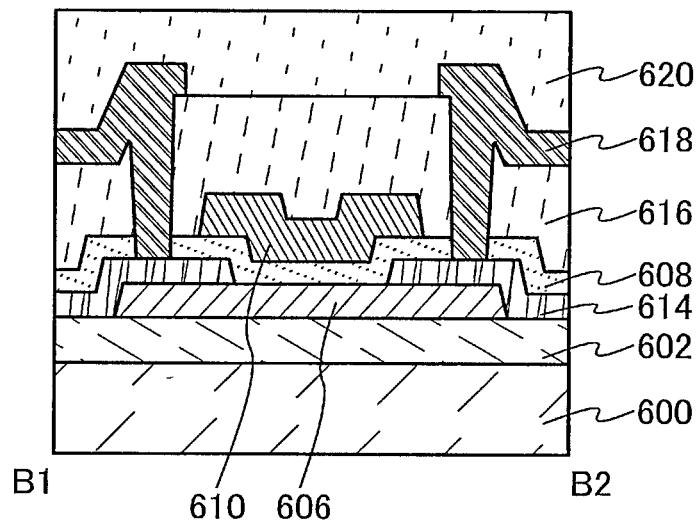

FIGS. 30A and 30B are a top view and a cross-sectional view which illustrate a structure of a transistor fabricated in this embodiment. FIG. 30A is the top view of the transistor. FIG. 30B is a cross-sectional view along dashed-dotted line B1-B2 in FIG. 30A.

The transistor illustrated in FIG. 30B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure illustrated in FIG. 30A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as d W.

The transistor of this embodiment can be combined as appropriate with any of the configurations, methods, and the like described in the other embodiments.

This application is based on Japanese Patent Application serial no. 2011-102585 filed with Japan Patent Office on Apr. 29, 2011, and Japanese Patent Application serial No. 2011-113316 filed with Japan Patent Office on May 20, 2011, the entire contents of which are hereby incorporated by reference.

What is claimed is:

1. A semiconductor device comprising:
    an input/output block;
    a first logic block electrically connected to the input/output block; and
    a second logic block electrically connected to the input/output block and the first logic block;
    wherein each of the first logic block and the second logic block comprises:
        a logic element;
        a look-up table in the logic element;
        a configuration memory in the look-up table, the configuration memory holding a configuration data; and
        a selection circuit in the look-up table,
    wherein the configuration memory comprises a memory element,
    wherein the memory element comprises a transistor and an arithmetic circuit,
    wherein the transistor comprises a channel region,
    wherein the channel region comprises an oxide semiconductor, wherein the configuration data is configured to be held in a connection portion between the transistor and the arithmetic circuit, and wherein the logic element outputs a signal in accordance with an output signal from the look-up table.

2. The semiconductor device according to claim 1, further comprising:

a capacitor connected to the connection portion.

3. The semiconductor device according to claim 1, wherein the arithmetic circuit is an inverter, a buffer, a NAND circuit, an AND circuit, a NOR circuit, or an OR circuit.

4. The semiconductor device according to claim 1, wherein a gate electrode of the transistor is electrically connected to a word line, and wherein one of a source and a drain of the transistor is electrically connected to a bit line.

5. The semiconductor device according to claim 1, further comprising:

one of a multiplier and a phase locked loop block.

6. A semiconductor device comprising:

an input/output block;

a first logic block electrically connected to the input/output block; and a second logic block electrically connected to the input/output block and the first logic block;

wherein each of the first logic block and the second logic block comprises:

a first logic element; and a second logic element electrically connected to the first logic element;

wherein each of the first logic element and the second logic element comprises:

a look-up table;

a configuration memory in the look-up table, the configuration memory holding a configuration data; and a selection circuit in the look-up table, wherein the configuration memory comprises a memory element, wherein the memory element comprises a transistor and an arithmetic circuit, wherein the transistor comprises a channel region, wherein the channel region comprises an oxide semiconductor, wherein the configuration data is configured to be held in a connection portion between the transistor and the arithmetic circuit, and wherein the first logic element outputs a signal in accordance with an output signal from the look-up table, wherein the signal inputs to the second logic element.

7. The semiconductor device according to claim 6, further comprising:

a capacitor connected to the connection portion.

8. The semiconductor device according to claim 6, wherein the arithmetic circuit is an inverter, a buffer, a NAND circuit, an AND circuit, a NOR circuit, or an OR circuit.

9. The semiconductor device according to claim 6, wherein a gate electrode of the transistor is electrically connected to a word line, and wherein one of a source and a drain of the transistor is electrically connected to a bit line.

10. The semiconductor device according to claim 6, further comprising:

one of a multiplier and a phase locked loop block.

11. A programmable logic device comprising:

an input/output block; and a plurality of logic blocks, wherein each of the plurality of logic blocks comprises a logic element comprising a look-up table comprising:

a configuration memory holding configuration data; and a selection circuit, wherein the configuration memory comprises $2^N$ (N is a natural number) memory elements, wherein each of the $2^N$ memory elements comprises:

a transistor comprising a channel region comprising an oxide semiconductor film; and an arithmetic circuit, wherein the configuration memory holds configuration data in a connection portion between one of a source and a drain of the transistor and the arithmetic circuit, wherein the selection circuit outputs a signal in accordance with output signals of the $2^N$ arithmetic circuits and signals of N input terminals, and wherein the oxide semiconductor film comprises indium.

12. The programmable logic device according to claim 11, further comprising a capacitor connected to the connection portion between the one of the source and the drain of the transistor and the arithmetic circuit.

13. The programmable logic device according to claim 11, wherein the arithmetic circuit is an inverter, a buffer, a NAND circuit, an AND circuit, a NOR circuit, or an OR circuit.

14. The programmable logic device according to claim 11, wherein the transistor whose channel region is in the oxide semiconductor film has a gate electrode connected to a word line and the other of the source and the drain connected to a bit line.

15. A programmable logic device comprising a look-up table comprising a memory element comprising:

a first transistor comprising a first gate, a first source, and a first drain;

a second transistor comprising a second gate, a second source, and a second drain;

a third transistor comprising a third gate, a third source, and a third drain;

a fourth transistor comprising a fourth gate, a fourth source, and a fourth drain; and a fifth transistor comprising a fifth gate, a fifth source, and a fifth drain, wherein the first transistor comprises a channel region, wherein the channel region comprises an oxide semiconductor film, wherein the oxide semiconductor film comprises indium, wherein the first gate is electrically connected to a word line, wherein one of the first source and the first drain is electrically connected a bit line, wherein the other of the first source and the first drain is electrically connected to the second gate and the third gate, wherein one of the second source and the second drain is electrically connected to one of the third source and the third drain, the fourth gate, and the fifth gate, wherein one of the fourth source and the fourth drain is electrically connected to one of the fifth source and the fifth drain, and an output terminal, wherein the other of the second source and the second drain is electrically connected to the other of the fourth source and the fourth drain, and wherein the other of the third source and the third drain is electrically connected to the other of the fifth source and the fifth drain.

16. The programmable logic device according to claim 15,
wherein each of the second transistor and the fourth transistor is an n-channel transistor, and
wherein each of the third transistor and the fifth transistor is a p-channel transistor.

17. The semiconductor device according to claim 1, wherein the oxide semiconductor comprises indium.

18. The semiconductor device according to claim 6, wherein the oxide semiconductor comprises indium.

* * * * *